(12) United States Patent
Suzuki et al.

(10) Patent No.: US 9,019,478 B2
(45) Date of Patent: Apr. 28, 2015

(54) RANGE SENSOR AND RANGE IMAGE SENSOR

(75) Inventors: Takashi Suzuki, Hamamatsu (JP); Mitsuhito Mase, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/498,237

(22) PCT Filed: Nov. 18, 2010

(86) PCT No.: PCT/JP2010/070578
§ 371 (c)(1),
(2), (4) Date: Mar. 26, 2012

(87) PCT Pub. No.: WO2011/065280
PCT Pub. Date: Jun. 3, 2011

(65) Prior Publication Data
US 2012/0182540 A1 Jul. 19, 2012

(30) Foreign Application Priority Data

Nov. 24, 2009 (JP) ................................ 2009-266566
Oct. 12, 2010 (JP) ................................ 2010-229906

(51) Int. Cl.
*G01C 3/08* (2006.01)
*H01L 27/146* (2006.01)
*G01S 7/481* (2006.01)
*G01S 7/486* (2006.01)
*G01S 17/89* (2006.01)

(52) U.S. Cl.
CPC ......... *H01L 27/14603* (2013.01); *G01S 7/4814* (2013.01); *G01S 7/4816* (2013.01); *G01S 7/4863* (2013.01); *G01S 17/89* (2013.01); *H01L 27/14609* (2013.01); *H01L 27/14607* (2013.01); *H01L 27/14612* (2013.01)

(58) Field of Classification Search
USPC ........................................................ 356/4.01
See application file for complete search history.

(56) References Cited

U.S. PATENT DOCUMENTS 5,990,953 A * 11/1999 Nakashiba .................... 348/314
7,884,310 B2 2/2011 Buettgen
(Continued)

FOREIGN PATENT DOCUMENTS

EP 1 777 747 4/2007
EP 2 187 237 5/2010
(Continued)

*Primary Examiner* — Luke Ratcliffe
*Assistant Examiner* — Vicente Rodriguez
(74) *Attorney, Agent, or Firm* — Drinker Biddle & Reath LLP

(57) ABSTRACT

A range image sensor RS is provided with an imaging region consisting of a plurality of units arranged in a two-dimensional pattern, on a semiconductor substrate 1 and obtains a range image, based on charge quantities output from the units. One unit is provided with a photosensitive region, a plurality of third semiconductor regions 9a, 9b opposed to each other with a photogate electrode PG in between in a direction in which first and second long sides L1, L2 are opposed to each other, first and second transfer electrodes TX1, TX2 provided between the plurality of third semiconductor regions 9a, 9b and the photogate electrode PG, a plurality of fourth semiconductor regions 11a, 11b arranged with the third semiconductor regions 9a, 9b in between in the direction in which the first and second long sides L1, L2 are opposed to each other, and a plurality of third transfer electrodes TX3 provided respectively between the plurality of fourth semiconductor regions 11a, 11b and the photogate electrode PG.

10 Claims, 23 Drawing Sheets

(56) References Cited

U.S. PATENT DOCUMENTS

| | | |
|---|---|---|
| 8,115,158 B2 | 2/2012 | Buettgen |
| 2009/0230437 A1* | 9/2009 | Kawahito et al. ............ 257/226 |

FOREIGN PATENT DOCUMENTS

| | | |
|---|---|---|
| JP | H9-223788 | 8/1997 |
| JP | 2004-294420 | 10/2004 |
| JP | 2008-145348 | 6/2006 |
| JP | 2007-150008 | 6/2007 |
| JP | 2008-8700 | 1/2008 |
| JP | 2009-515147 | 4/2009 |
| WO | 2007/026779 | 3/2007 |
| WO | WO 2007/026777 | 3/2007 |
| WO | 2007/119626 | 10/2007 |
| WO | WO 2009/025373 | 2/2009 |
| WO | 2010/013811 | 2/2010 |
| WO | WO 2011/065286 | 6/2011 |

* cited by examiner

RANGE SENSOR AND RANGE IMAGE SENSOR

TECHNICAL FIELD

The present invention relates to a range sensor and a range image sensor.

BACKGROUND ART

A conventional active type optical distance measuring sensor is known as a device configured to irradiate light from a light source for projection of light such as an LED (Light Emitting Diode) toward an object, to detect reflected light from the object with a photodetecting element, and thereby to output a signal according to the distance to the object. For example, a PSD (Position Sensitive Detector) is known as an optical distance measuring sensor of an optical triangulation type capable of readily measuring the distance to the object. In recent years, however, there are expectations for development of an optical distance measuring sensor of an optical TOF (Time-Of-Flight) type, in order to achieve more accurate distance measurement.

There are demands for an image sensor capable of simultaneously acquiring distance information and image information by a single chip, for example, in on-vehicle use, use in automatic manufacture systems in factories, and so on. There are also expectations for an image sensor capable of acquiring a range image consisting of a single piece of distance information or multiple pieces of distance information, separately from the image information. It is preferable to apply the TOF method to such a distance measuring sensor.

For example, a solid-state imaging device described in Patent Literature 1 is known as a range image sensor based on the foregoing TOF method. In the range image sensor described in Patent Literature 1, each of pixels arrayed in a two-dimensional pattern is composed of a rectangular charge generating region, transfer gate electrodes provided respectively along a pair of two opposed sides of the charge generating region, floating drain regions for accumulating respective signal charges transferred by the transfer gate electrodes, discharge gate electrodes provided respectively along a different pair of two opposed sides of the charge generating region and configured to discharge background light charges from the charge generating region, and discharge drain regions for accepting respective background light charges discharged by the discharge gate electrodes. This range image sensor calculates the distance to the object, based on quantities of charges distributed into the floating drain regions. Since the background light charges generated in the charge generating region are discharged, influence of background light is reduced, so as to increase the dynamic range.

CITATION LIST

Patent Literature

Patent Literature 1: International Publication WO2007/026779

SUMMARY OF INVENTION

Technical Problem

In the range image sensor described in Patent Literature 1, however, the perimeter of the charge generating region is surrounded, though in part, by the discharge gate electrodes in each pixel. For this reason, the range image sensor described in Patent Literature 1 has a problem of a low aperture ratio.

The present invention has been accomplished in order to solve the above problem and it is an object of the present invention to provide a range sensor and a range image sensor with an improved aperture ratio.

Solution to Problem

A range sensor according to the present invention is a range sensor comprising: a photosensitive region which generates charge according to incident light and which has a planar shape having first and second long sides opposed to each other and first and second short sides opposed to each other; a plurality of signal charge collecting regions which are arranged opposite to each other with the photosensitive region in between in a direction in which the first and second long sides are opposed to each other, and which collect signal charges from the photosensitive region; a plurality of transfer electrodes which are given respective charge transfer signals of different phases and which are provided respectively between the plurality of signal charge collecting regions and the photosensitive region; a plurality of first unnecessary charge collecting regions which are arranged as spatially separated from each other so as to be located on either side of the signal charge collecting region on the side where the first long side exists and along the first long side and which collect unnecessary charge from the photosensitive region; a plurality of second unnecessary charge collecting regions which are arranged as spatially separated from each other so as to be opposed to the plurality of first unnecessary charge collecting regions with the photosensitive region in between in the direction in which the first and second long sides are opposed to each other and so as to be located on either side of the signal charge collecting region on the side where the second long side exists and along the second long side, and which collect unnecessary charge from the photosensitive region; and a plurality of unnecessary charge collecting gate electrodes which are provided respectively between the plurality of first and second unnecessary charge collecting regions and the photosensitive region and which selectively perform closing and opening of flow of unnecessary charge from the photosensitive region to the first and second unnecessary charge collecting regions.

In the range sensor according to the present invention, the plurality of signal charge collecting regions are arranged opposite to each other with the photosensitive region in between in the direction in which the first and second long sides are opposed to each other, and the transfer electrodes are provided respectively between the plurality of signal charge collecting regions and the photosensitive region. On the side where the first long side exists, the plurality of first unnecessary charge collecting regions are arranged as spatially separated from each other so as to be located on either side of the signal charge collecting region along the first long side. The plurality of second unnecessary charge collecting regions are arranged opposite to the plurality of first unnecessary charge collecting regions on the side where the second long side exists. The unnecessary charge collecting gate electrodes are provided respectively between the plurality of first and second unnecessary charge collecting regions and the photosensitive region. Since this configuration has no electrode arranged in a direction in which the first and second short sides of the photosensitive region are opposed to each other, the aperture ratio is remarkably improved, when compared to the configuration wherein the transfer electrodes and unnecessary charge collecting gate electrodes are arranged so as to surround the photosensitive region.

In the range sensor according to the present invention, the signal charge and unnecessary charge generated in the photosensitive region are transferred in the direction in which the first and second long sides are opposed to each other, by the transfer electrodes and unnecessary charge collecting gate electrodes. For this reason, the distance is kept constant in the direction in which the first and second long sides are opposed to each other, even in a configuration wherein the photosensitive region is formed in an expanded size in the direction in which the first and second short sides are opposed to each other. This ensures a sufficient transfer speed of charge in the transfer electrodes and unnecessary charge collecting gate electrodes. Therefore, the aperture ratio is improved while ensuring the sufficient transfer speed. As a consequence, a range image is obtained with a high S/N ratio.

A length of the transfer electrodes in a direction along the first and second long sides may be larger than a length of the unnecessary charge collecting gate electrodes in the direction along the first and second long sides. When the length of the transfer electrodes in the direction along the first and second long sides, i.e., the gate width of the transfer electrodes is set longer than the gate width of the unnecessary charge collecting gate electrodes, the transfer speed of signal charge in the transfer electrodes can be increased.

Outside edges of the unnecessary charge collecting gate electrodes in the direction in which the first and second short sides are opposed to each other may be substantially flush with two edges of the photosensitive region in the direction in which the first and second short sides are opposed to each other. The outside edges of the unnecessary charge collecting gate electrodes in the direction in which the first and second short sides are opposed to each other may be located on the inside of the two edges of the photosensitive region in the direction in which the first and second short sides are opposed to each other. These configurations allow the range sensors adjacent to each other in the opposed direction of the first and second short sides to be arranged in proximity, for example, in a configuration wherein the range sensors are arranged in a two-dimensional pattern.

A range image sensor according to the present invention is a range image sensor which comprises an imaging region consisting of a plurality of units arranged in a one-dimensional or two-dimensional pattern, on a semiconductor substrate and which obtains a range image, based on charge quantities output from the units, wherein one unit is the aforementioned range sensor. Since the range image sensor according to the present invention comprises the aforementioned range sensor, the aperture ratio is improved.

The outside edges of the unnecessary charge collecting gate electrodes in the direction in which the first and second short sides are opposed to each other may be more projecting to the outside than the two edges of the photosensitive region in the direction in which the first and second short sides are opposed to each other. A plurality of photosensitive regions may be arranged in the direction in which the first and second short sides of the photosensitive region are opposed to each other, on the semiconductor substrate, and the plurality of unnecessary charge collecting gate electrodes may be arranged across a boundary between two adjacent photosensitive regions. In this case, the unnecessary charge collecting gate electrodes are shared by the two adjacent photosensitive regions. The first and second unnecessary charge collecting regions are also shared by the two adjacent photosensitive regions. For this reason, this configuration simplifies manufacture of the units in the range image sensor.

Advantageous Effect of Invention

The present invention achieves the improvement in the aperture ratio.

DESCRIPTION OF EMBODIMENTS

The preferred embodiments of the present invention will be described below in detail with reference to the drawings. In the description the same elements or elements with the same functionality will be denoted by the same reference signs, without redundant description.

Figure 1:
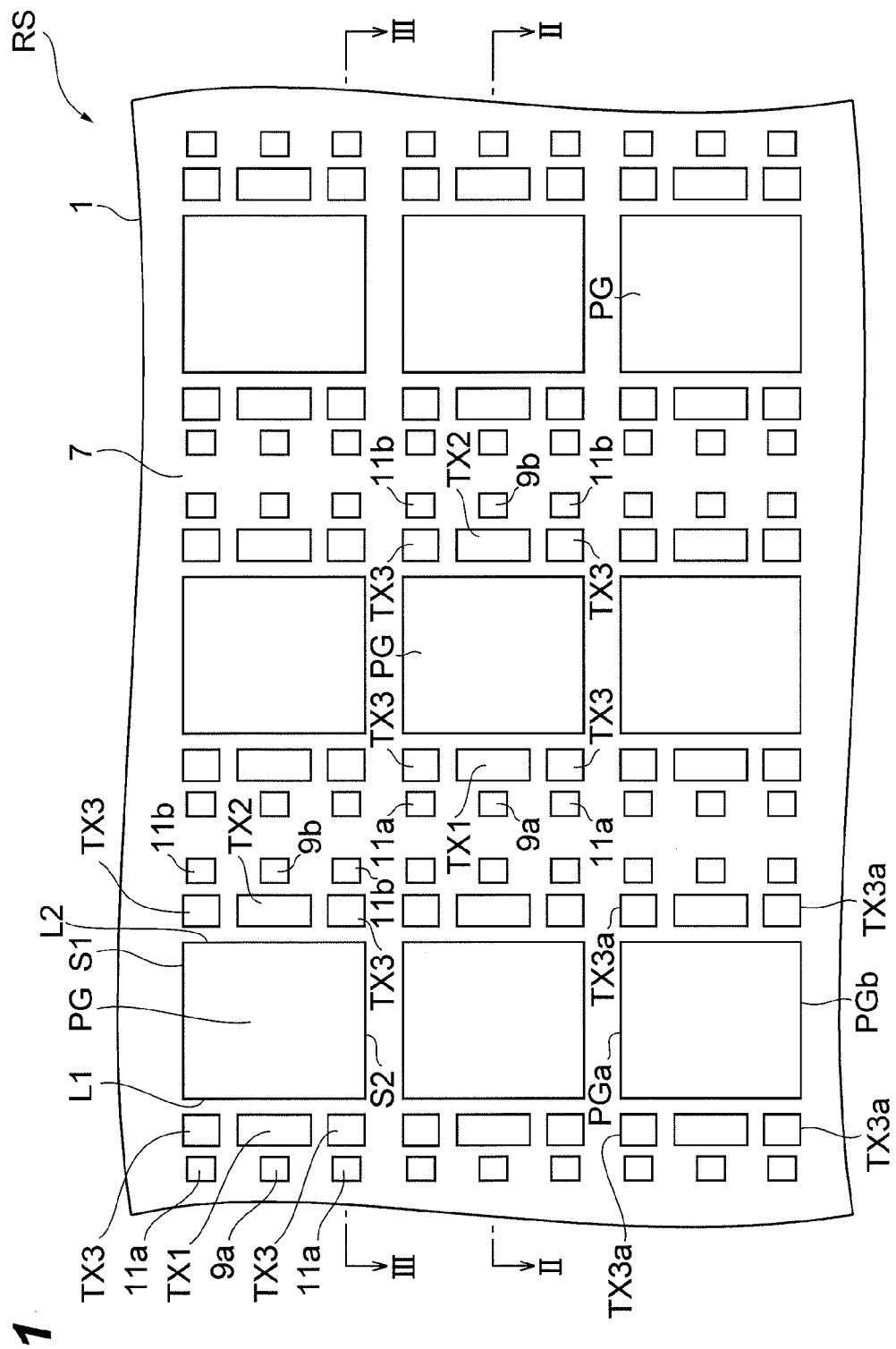
FIG. 1 is a schematic plan view of an imaging region in a range image sensor according to an embodiment of the present invention.
Figure 2:
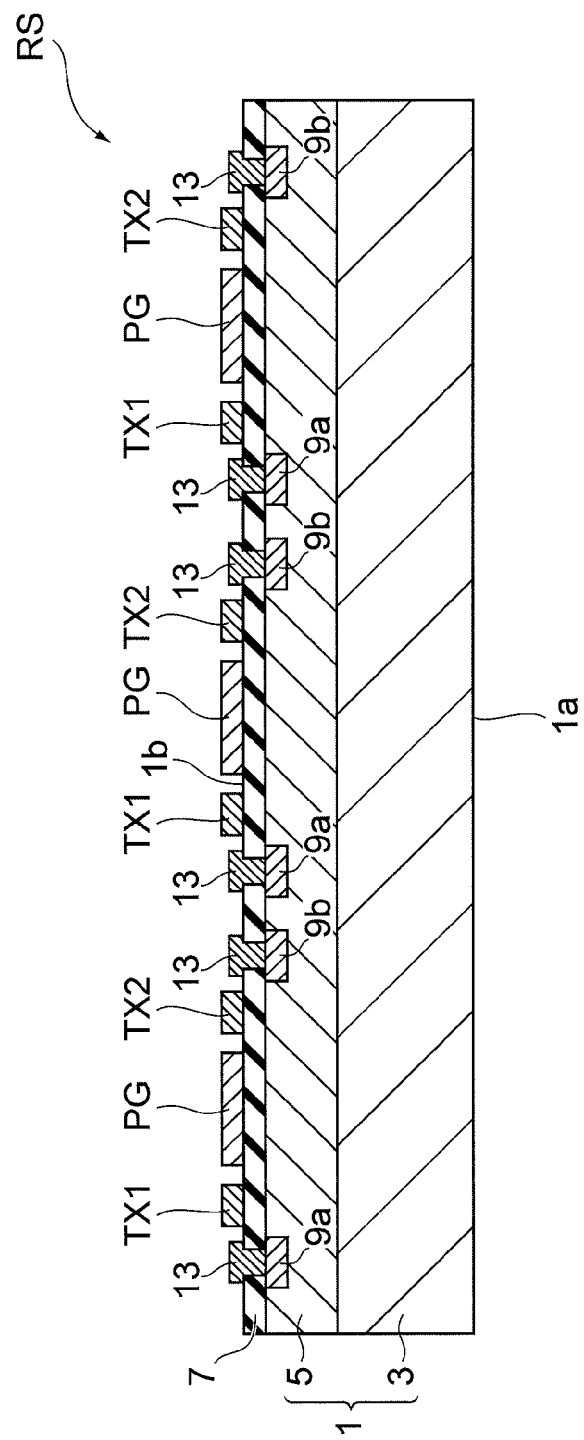
FIG. 2 is a drawing showing a cross-sectional configuration of the imaging region along the line II-II.
Figure 3:
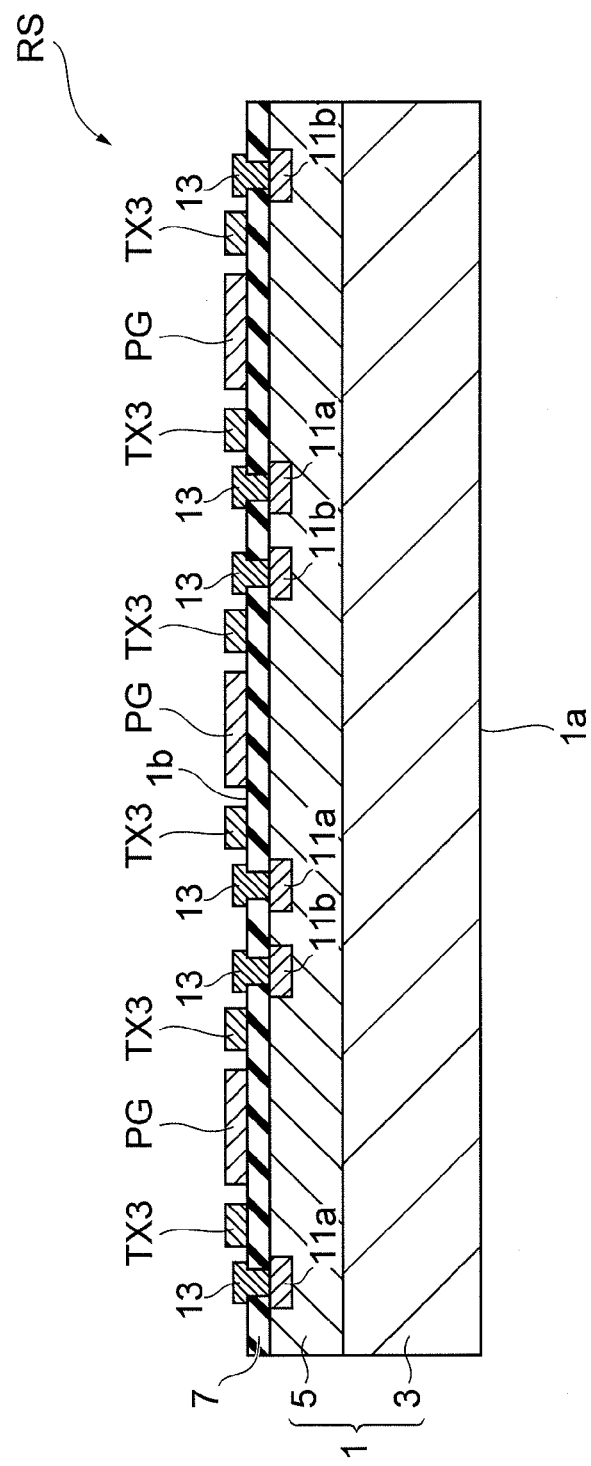
FIG. 3 is a drawing showing a cross-sectional configuration of the imaging region along the line III-III.

FIG. 1 is a schematic plan view of an imaging region of a range image sensor according to an embodiment of the present invention. FIG. 2 is a drawing showing a cross-sectional configuration of the imaging region along the line II-II and FIG. 3 a drawing showing a cross-sectional configuration of the imaging region along the line III-III.

The range image sensor RS is provided with a semiconductor substrate 1 having first and second principal surfaces 1a, 1b opposed to each other. The semiconductor substrate 1 is composed of a p-type first semiconductor region 3 located on the first principal surface 1a side, and a p− type second semiconductor region 5 having a lower impurity concentration than the first semiconductor region 3 and located on the second principal surface 1b side. The semiconductor substrate 1 can be obtained, for example, by growing on a p-type semiconductor substrate, a p− type epitaxial layer having a lower impurity concentration than the semiconductor substrate. An insulating layer 7 is formed on the second principal surface 1b (or on the second semiconductor region 5) of the semiconductor substrate 1.

On the insulating layer 7, there are a plurality of photogate electrodes PG arranged in a two-dimensional pattern as spatially separated from each other. The photogate electrodes PG have a rectangular shape on the plan view. In the present embodiment, the photogate electrodes PG have a rectangle shape. Namely, the photogate electrodes PG have a planar shape having first and second long sides L1, L2 parallel to an arrangement direction of the photogate electrodes PG and opposite to each other, and first and second short sides S1, S2 perpendicular to the first and second long sides L1, L2 and opposite to each other. Regions corresponding to the photogate electrodes PG in the semiconductor substrate 1 (or in the second semiconductor region 5) (i.e., regions located below the photogate electrodes PG in FIG. 2 and FIG. 3) function as charge generating regions (photosensitive regions) where charge is generated according to incident light.

In the second semiconductor region 5, n-type third semiconductor regions (signal charge collecting regions) 9a, 9b with a high impurity concentration are formed opposite to each other in respective regions located away from each photogate electrode PG. Namely, the third semiconductor regions 9a, 9b are arranged opposite to each other with the photogate electrode PG in between in a direction in which the first and second long sides L1, L2 are opposed to each other. The third semiconductor region 9a is arranged on the side where the first long side L1 out of the four sides of the photogate electrode PG exists, and the third semiconductor region 9b is arranged on the side where the second long side L2 exists opposite to the first long side L1 where the third semiconductor region 9a is arranged, out of the four sides of the photogate electrode PG. The third semiconductor regions 9a, 9b have a rectangular shape on the plan view. In the present embodiment, the third semiconductor regions 9a, 9b have a square shape.

In the second semiconductor region 5, there are n-type fourth semiconductor regions (first and second unnecessary charge collecting regions) 11a, 11b with a high impurity concentration formed in respective regions located away from each photogate electrode PG. In the present embodiment, two pairs of fourth semiconductor regions 11a, 11b are arranged for each of the photogate electrodes PG. The fourth semiconductor regions 11a are arranged on the side where the first long side L1 out of the four sides of the photogate electrode PG exists and along the first long side L1 and with the third semiconductor region 9a in between in a direction in which the first and second short sides S1, S2 are opposed to each other, and the fourth semiconductor regions 11b are arranged on the side where the second long side L2 exists opposite to the first long side L1 where the fourth semiconductor regions 11a are arranged, out of the four sides of the photogate electrode PG, and along the second long side L2 and with the third semiconductor region 9b in between in the direction in which the first and second short sides S1, S2 are opposed to each other. The fourth semiconductor regions 11a, 11b have a rectangular shape on the plan view. In the present embodiment, the fourth semiconductor regions 11a, 11b have a square shape.

In the present embodiment, the "high impurity concentration" refers, for example, to an impurity concentration of not less than about $1\times10^{17}$ cm$^{-3}$ and is denoted by "+" attached to the conductivity type. The "low impurity concentration" refers, for example, to an impurity concentration of not more than about $10\times10^{15}$ cm$^{-3}$ and is denoted by "−" attached to the conductivity type.

The thicknesses/impurity concentrations of the respective semiconductor regions are as described below.
First semiconductor region 3: thickness 10-1000 µm/impurity concentration $1\times10^{12}$-$10^{19}$ cm$^{-3}$
Second semiconductor region 5: thickness 1-50 µm/impurity concentration $1\times10^{12}$-$10^{15}$ cm$^{-3}$
Third semiconductor regions 9a, 9b and fourth semiconductor regions 11a, 11b: thickness 0.1-1 µm/impurity concentration $1\times10^{18}$-$10^{20}$ cm$^{-3}$ A reference potential such as the ground potential is supplied through a back gate, a through-silicon via, or the like to the semiconductor substrate 1 (first and second semiconductor regions 3, 5).

On the insulating layer 7, a first transfer electrode TX1 and a second transfer electrode TX2 each are arranged corresponding to each photogate electrode PG. The first transfer electrode TX1 is located between the photogate electrode PG and the third semiconductor region 9a on the first long side L1 side and arranged away from the photogate electrode PG. The second transfer electrode TX2 is located between the photogate electrode PG and the third semiconductor region 9b on the second long side L2 side opposite to the first long side L1 and arranged away from the photogate electrode PG. The first and second transfer electrodes TX1 and TX2 have a rectangular shape on the plan view. In the present embodiment, the first and second transfer electrodes TX1 and TX2 have a rectangle shape having the long-side direction parallel to the arrangement direction of the photogate electrodes PG.

On the insulating layer 7, third transfer electrodes TX3 functioning as unnecessary charge collecting gate electrodes each are arranged corresponding to each photogate electrode PG. The third transfer electrodes TX3 are located between the photogate electrode PG and the fourth semiconductor regions 11a, 11b and arranged away from the photogate electrode PG with the first transfer electrode TX1 and the second transfer electrode TX2 in between, in the direction in which the first and second short sides S1, S2 are opposed to each other. The third transfer electrodes TX3 have a rectangular shape on the plan view. In the present embodiment, the third transfer electrodes TX3 have a rectangle shape having the long-side direction parallel to the arrangement direction of the photogate electrodes PG and the length thereof is shorter than the length of the first and second transfer electrodes TX1, TX2. Outside edges TX3a of the third transfer electrodes TX3 in the opposed direction of the first and second short sides S1, S2 are approximately flush with the two edges PGa, PGb of the photogate electrode PG in the opposed direction of the first and second short sides S1, S2.

The lengths of the first to third transfer electrodes TX1-TX3 in the opposed direction of the first and second short sides S1, S2, i.e., the gate widths of the first to third transfer electrodes TX1-TX3 are determined according to distances allowable for transfer of signal charge and unnecessary charge, so as to cover regions of the photogate electrode PG to enable high-speed transfer of signal charge and unnecessary charge in the first to third transfer electrodes TX1-TX3.

In the present embodiment, one pixel (range sensor) in the range image sensor RS is composed of one photogate electrode PG, a region corresponding to the photogate electrode PG in the semiconductor substrate 1 (photosensitive region), a pair of first transfer electrode TX1 and second transfer electrode TX2, a pair of third semiconductor regions 9a, 9b, two pairs of third transfer electrodes TX3, and two pairs of fourth semiconductor regions 11a, 11b.

The insulating layer 7 is provided with contact holes for exposing the surface of the first semiconductor region 3. Conductors 13 to connect the third semiconductor regions 9a, 9b and the fourth semiconductor regions 11a, 11b to the outside are arranged in the contact holes.

The semiconductor substrate is comprised of Si, the insulating layer 7 is comprised of $SiO_2$, and the photogate electrodes PG and the first to third transfer electrodes TX1-TX3 are comprised of polysilicon, but they may be comprised of other materials.

The third semiconductor regions 9a, 9b are regions which collect the signal charge generated in the photosensitive region in the semiconductor substrate 1 according to incidence of light. There is a phase difference of 180° between the phase of a charge transfer signal applied to the first transfer electrode TX1 and the phase of a charge transfer signal applied to the second transfer electrode TX2. Light incident into one pixel is converted into charge in the semiconductor substrate 1 (second semiconductor region 5) and a part of the charge generated in this manner migrates as signal charge toward the first transfer electrode TX1 or toward the second transfer electrode TX2, i.e., in a direction parallel to the first and second short sides S1, S2 of the photogate electrode PG, according to a potential gradient created by voltages applied to the photogate electrode PG and the first and second transfer electrodes TX1 and TX2.

When a positive potential is given to the first or second transfer electrode TX1, TX2, a potential under the first or second transfer electrode TX1, TX2 becomes lower with respect to electrons than the potential of the semiconductor substrate 1 (second semiconductor region 5) in the portion below the photogate electrode PG, whereby the negative charge (electrons) is drawn toward the first or second transfer electrode TX1, TX2 and accumulated in a potential well formed by the third semiconductor region 9a or the third semiconductor region 9b. An n-type semiconductor contains a positively ionized donor and has a positive potential to attract electrons. When a potential lower than the foregoing positive potential (e.g., the ground potential) is given to the first or second transfer electrode TX1, TX2, a potential barrier is created by the first or second transfer electrode TX1, TX2 and the charge generated in the semiconductor substrate 1 is not drawn into the third semiconductor region 9a or the third semiconductor region 9b.

The fourth semiconductor regions 11a, 11b are regions which collect unnecessary charge generated in the photosensitive region in the semiconductor substrate 1 according to incidence of light. Light incident into one pixel produces charge, and a part of the charge generated in the semiconductor substrate 1 (second semiconductor region 5) migrates as unnecessary charge toward the third transfer electrodes TX3 according to a potential gradient created by voltages applied to the photogate electrode PG and the third transfer electrodes TX3.

When a positive potential is given to the third transfer electrodes TX3, a potential under the third transfer electrodes TX3 becomes lower with respect to electrons than the potential of the semiconductor substrate 1 (second semiconductor region 5) in the portion below the photogate electrode PG, whereby the negative charge (electrons) is drawn toward the third transfer electrodes TX3 to be accumulated in potential wells formed by the fourth semiconductor regions 11a, 11b. When a potential (e.g., the ground potential) lower than the above positive potential is given to the third transfer electrodes TX3, the third transfer electrodes TX3 produce potential barriers, whereby the charge generated in the semiconductor substrate 1 is not drawn into the fourth semiconductor regions 11a, 11b.

Figure 4:
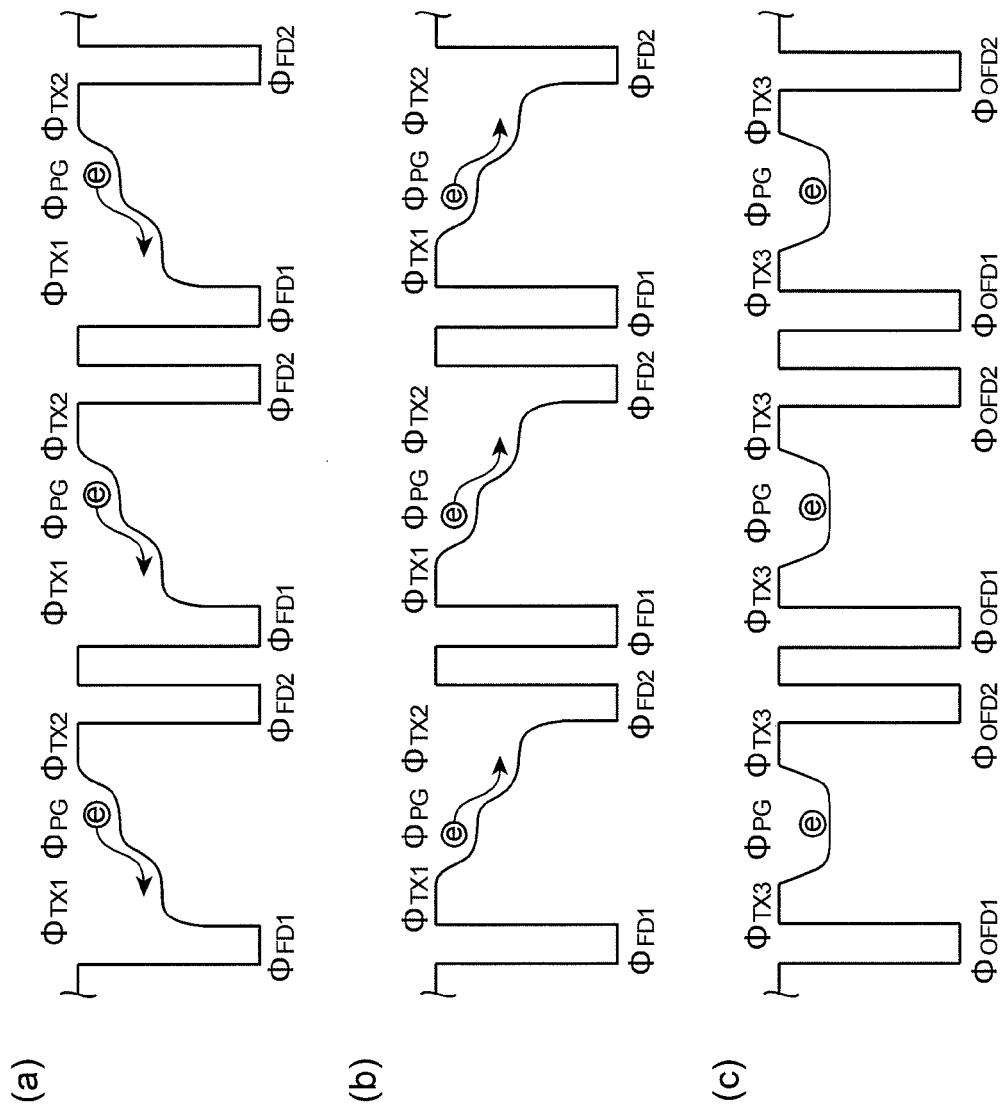
FIG. 4 is a drawing showing potential profiles near a second principal surface of a semiconductor substrate.
Figure 5:
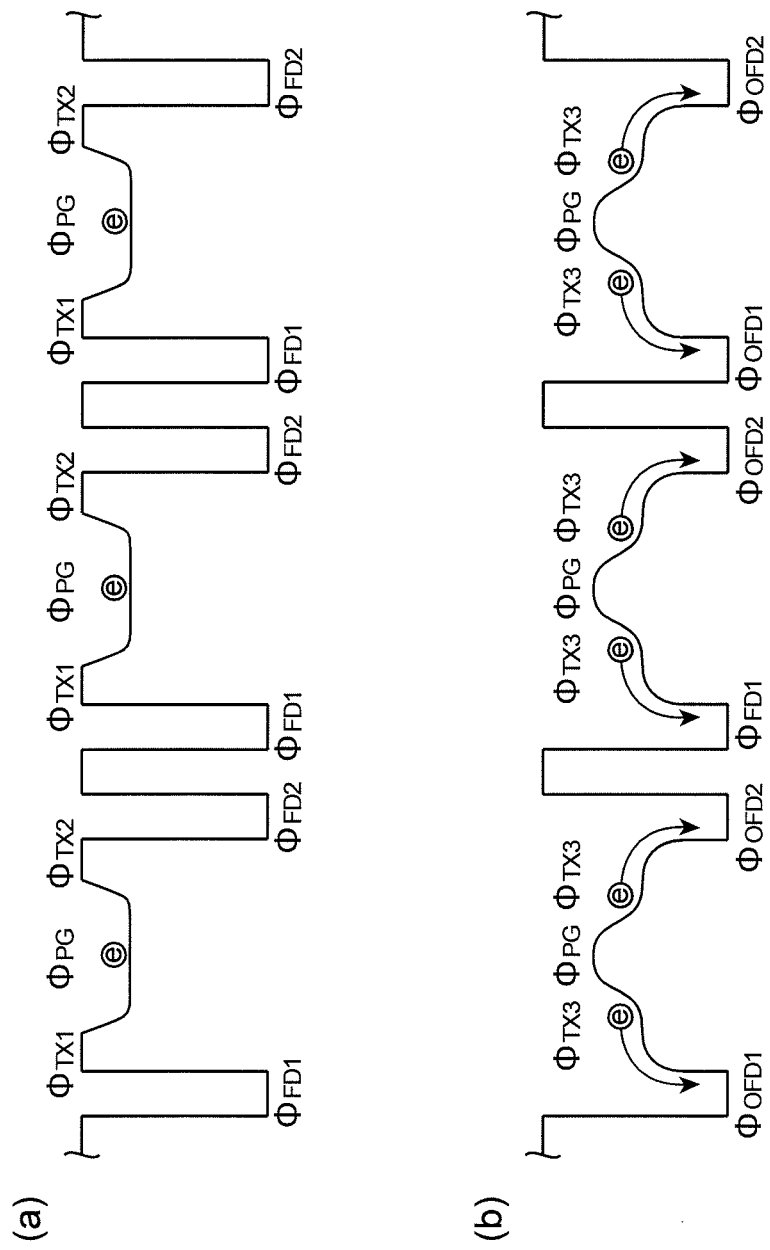
FIG. 5 is a drawing showing potential profiles near the second principal surface of the semiconductor substrate.

FIG. 4 is a drawing showing potential profiles near the second principal surface 1b of the semiconductor substrate 1, for explaining the accumulation operation of signal charge. FIG. 5 is a drawing showing potential profiles near the second principal surface 1b of the semiconductor substrate 1, for explaining the discharge operation of unnecessary charge. In FIGS. 4 and 5, the downward direction represents the positive direction of potential. In FIG. 4, (a) and (b) show potential profiles along the lateral direction of the lateral cross section of FIG. 2 and (c) a potential profile along the lateral direction of the lateral cross section of FIG. 3. In FIG. 5, (a) shows a potential profile along the lateral direction of the lateral cross section of FIG. 2 and (b) a potential profile along the lateral direction of the lateral cross section of FIG. 3.

In FIGS. 4 and 5, there are shown the potential $\Phi_{TX1}$ of the region immediately below the first transfer electrode TX1, the potential $\Phi_{TX2}$ of the region immediately below the second transfer electrode TX2, the potential $\Phi_{TX3}$ of the regions immediately below the third transfer electrodes TX3, the potential $\Phi_{PG}$ of the photosensitive region immediately below the photogate electrode PG, the potential $\Phi_{FD1}$ of the third semiconductor region 9a, the potential $\Phi_{FD2}$ of the third semiconductor region 9b, the potential $\Phi_{OFD1}$ of the fourth semiconductor regions 11a, and the potential $\Phi_{OFD2}$ of the fourth semiconductor regions 11b.

When a reference potential is defined as the potential ($\Phi_{TX1}$, $\Phi_{TX2}$, $\Phi_{TX3}$) of the regions immediately below the neighboring first to third transfer electrodes TX1-TX3 with no bias being applied, the potential $\Phi_{PG}$ of the region (photosensitive region) immediately below the photogate electrode PG is set higher than the reference potential. This potential $\Phi_{PG}$ of the photosensitive region is higher than the potentials $\Phi_{TX1}$, $\Phi_{TX2}$, and $\Phi_{TX3}$ and the potential profile of this region is a downwardly recessed shape in the drawing.

The accumulation operation of signal charge will be described with reference to FIG. 4.

When the phase of the charge transfer signal applied to the first transfer electrode TX1 is 0°, a positive potential is given to the first transfer electrode TX1 and a potential with the reverse phase, i.e., a potential with the phase of 180° (e.g., the ground potential) is given to the second transfer electrode TX2. In this case, as shown in FIG. 4 (a), the negative charge e generated in the photosensitive region flows into the potential well of the third semiconductor region 9a because the potential $\Phi_{TX1}$ of the semiconductor immediately below the first transfer electrode TX1 becomes lowered.

On the other hand, the potential $\Phi_{TX2}$ of the semiconductor immediately below the second transfer electrode TX2 is kept unchanged and thus the charge does not flow into the potential well of the third semiconductor region 9b. Since the third semiconductor regions 9a, 9b are doped with an n-type impurity, the potential is recessed in the positive direction.

When the phase of the charge transfer signal applied to the second transfer electrode TX2 is 0°, a positive potential is given to the second transfer electrode TX2 and a potential with the reverse phase, i.e., a potential with the phase of 180° (e.g., the ground potential) is given to the first transfer electrode TX1. In this case, as shown in FIG. 4 (b), the negative charge e generated in the photosensitive region flows into the potential well of the third semiconductor region 9b because the potential $\Phi_{TX2}$ of the semiconductor immediately below the second transfer electrode TX2 becomes lowered. On the other hand, the potential $\Phi_{TX1}$ of the semiconductor immediately below the first transfer electrode TX1 is kept unchanged and thus the charge does not flow into the potential well of the third semiconductor region 9a. This causes the signal charge to be collected into the potential well of the third semiconductor region 9b and accumulated therein.

While the charge transfer signals with the phase shift of 180° are applied to the first and second transfer electrodes TX1, TX2, for example, the ground potential is given to the third transfer electrodes TX3. For this reason, as shown in FIG. 4 (c), the potential $\Phi_{TX3}$ of the semiconductor immediately below the third transfer electrodes TX3 is kept unchanged and thus the charge does not flow into the potential wells of the fourth semiconductor regions 11.

According to the above operation, the signal charge is collected and accumulated in the potential wells of the third semiconductor regions 9a, 9b. The signal charges accumulated in the potential wells of the third semiconductor regions 9a, 9b are read out to the outside.

The discharge operation of unnecessary charge will be described with reference to FIG. 5.

For example, the ground potential is given to the first and second transfer electrodes TX1, TX2. For this reason, as shown in FIG. 5 (a), the potentials $\Phi_{TX1}$, $\Phi_{TX2}$ of the semiconductors immediately below the first and second transfer electrodes TX1, TX2 are kept unchanged and thus the charge does not flow into the potential wells of the third semiconductor regions 9a, 9b. On the other hand, a positive potential is given to the third transfer electrodes TX3. In this case, as shown in FIG. 5 (b), the negative charge e generated in the photosensitive region flows into the potential wells of the fourth semiconductor regions 11a, 11b because the potential $\Phi_{TX3}$ of the semiconductors immediately below the third transfer electrodes TX3 is lowered. The above operation causes the unnecessary charge to be collected into the potential wells of the fourth semiconductor regions 11a, 11b. The unnecessary charge collected in the potential wells of the fourth semiconductor regions 11a, 11b is discharged to the outside.

Figure 6:
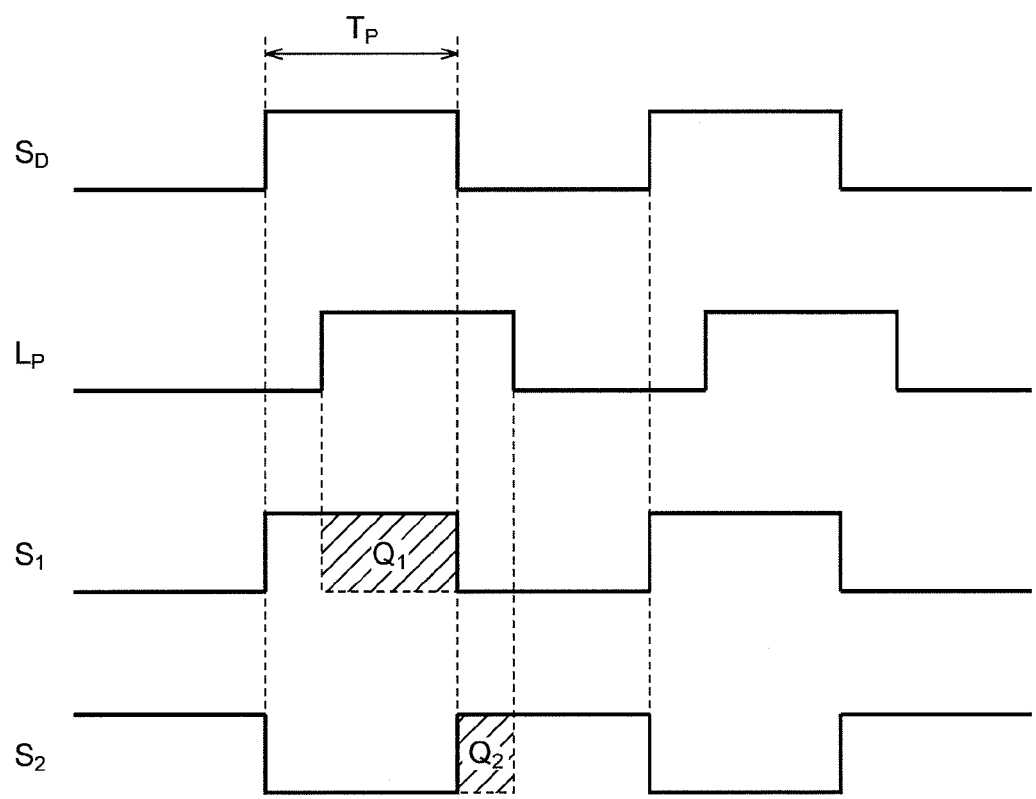
FIG. 6 is a timing chart of various signals.

FIG. 6 is a timing chart of various signals.

In FIG. 6, there are shown a drive signal $S_D$ of a below-described light source, an intensity signal $L_P$ of reflected light returning to an imaging region after the light from the light source is reflected by an object, a charge transfer signal $S_1$ applied to the first transfer electrode TX1, and a charge transfer signal $S_2$ applied to the second transfer electrode TX2. Since the charge transfer signal $S_1$ is synchronized with the drive signal $S_D$, the phase of the intensity signal $L_P$ of reflected light relative to the charge transfer signal $S_1$ corresponds to a time of flight of light and this represents the distance from the sensor to the object. An overlap between the intensity signal $L_P$ of reflected light and the charge transfer signal $S_1$ applied to the first transfer electrode TX1 corresponds to a charge quantity $Q_1$ collected in the third semiconductor region 9a and an overlap between the intensity signal $L_P$ of reflected light and the charge transfer signal $S_2$ applied to the second transfer electrode TX2 to a charge quantity $Q_2$ collected in the third semiconductor region 9b. In this case, the distance d is calculated using a ratio of the charge quantities $Q_1$, $Q_2$ collected in the third semiconductor regions 9a, 9b with application of the respective charge transfer signals $S_1$, $S_2$. Namely, the distance is given by $d=(c/2)\times(T_P\times Q_2/(Q_1+Q_2))$, where $T_P$ is the width of one pulse of the drive signal. It is noted that c represents the speed of light.

Figure 7:
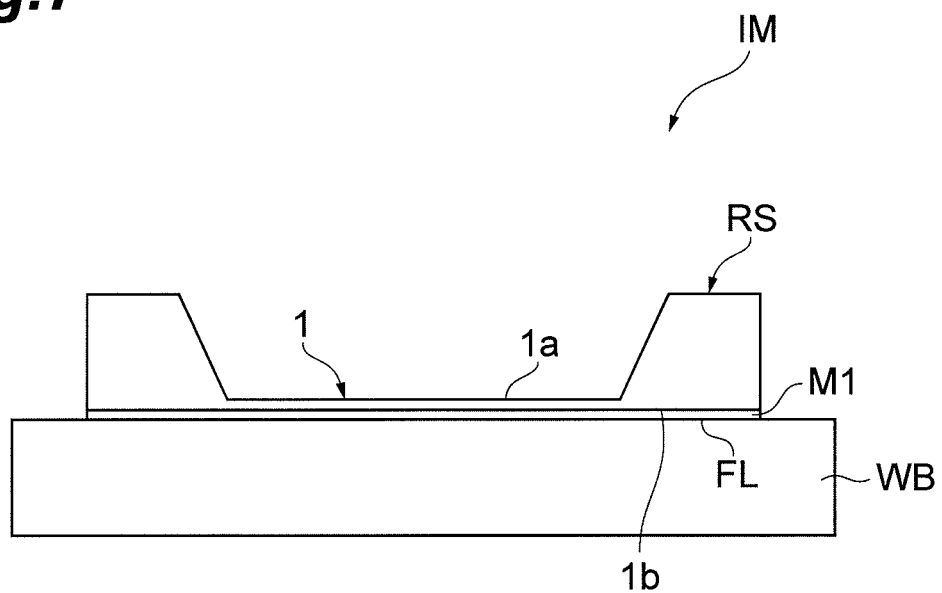
FIG. 7 is a cross-sectional view of an overall configuration of an imaging device.

FIG. 7 is a cross-sectional view of an entire configuration of an imaging device.

The imaging device IM is provided with a range image sensor RS and a wiring board WB. The range image sensor RS is a back-illuminated range image sensor. The range image sensor RS has its central region thinned in comparison with the peripheral portion and the thinned region serves as an imaging region, on which the reflected light from the object impinges. Since the range image sensor RS has no electrode on the light incident side of the charge generation portion, it is able to obtain a range output and a range image with high S/N ratios.

The range image sensor RS is bonded to the wiring board WB through a multilayer wiring board M1 and an adhesive FL in a state in which the second principal surface 1b side of the semiconductor substrate 1 is opposed to the wiring board WB. Inside the multilayer wiring board M1, there are provided penetrate electrodes (not shown) electrically connected respectively to the semiconductor regions 9a, 9b, 11a, 11b, the transfer electrodes TX1-TX3, the photogate electrodes PG, and others. The penetrate electrodes are connected to through-silicon vias (not shown) of the wiring board WB through bump electrodes (not shown) interposed between the wiring board WB and the multilayer wiring board M1, and the through-silicon vias of the wiring board WB are exposed in the back surface of the wiring board WB. A light shield layer (not shown) is formed on a surface of an insulating substrate forming the wiring board WB, on the interface side to the adhesive FL and the light shield layer prevents light transmitted through the range image sensor RS from entering the wiring board WB.

Figure 8:
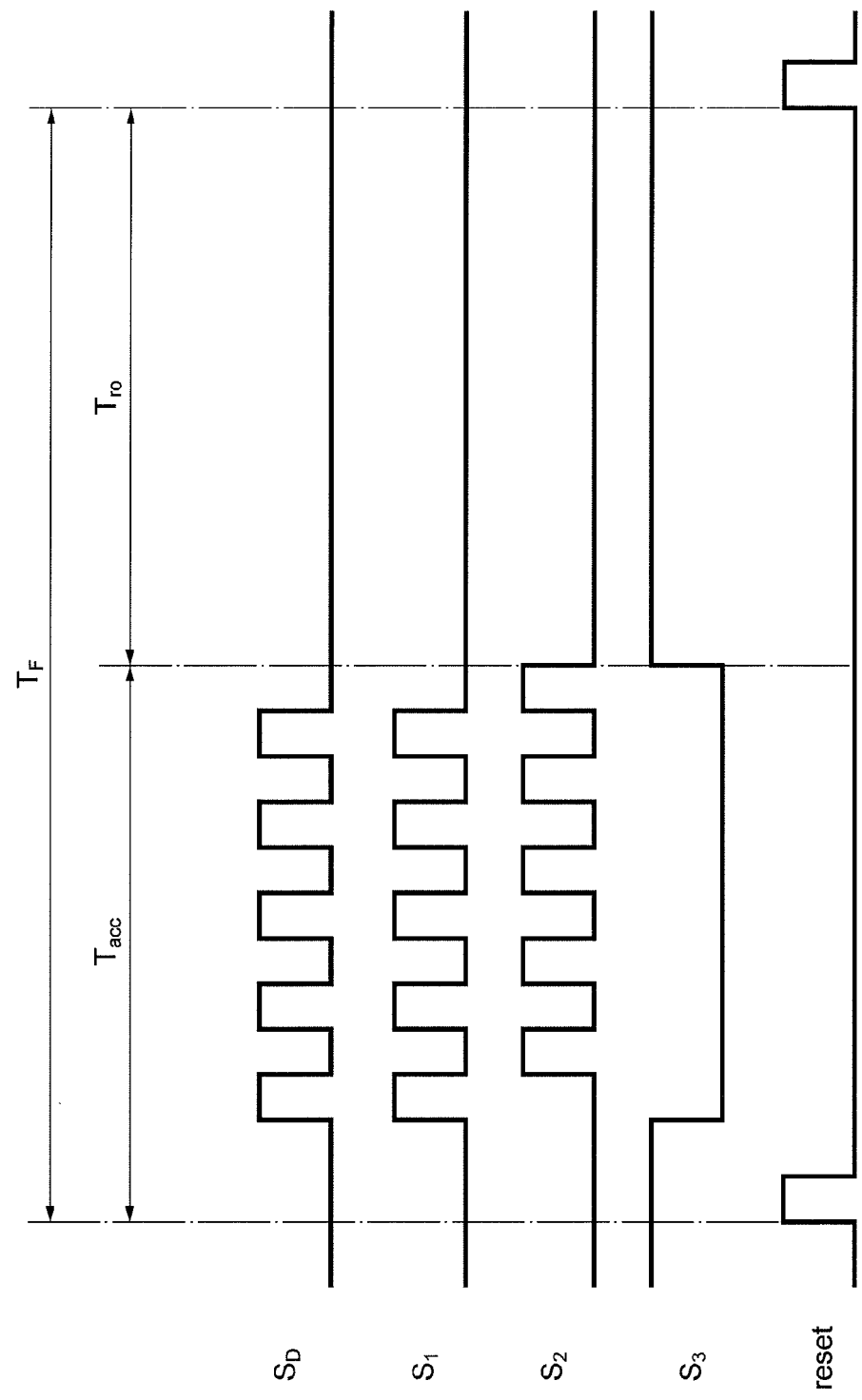
FIG. 8 is a timing chart of various signals.

FIG. 8 is a timing chart of actual various signals.

A period $T_F$ of one frame consists of a period for accumulation of signal charge (accumulation period) $T_{acc}$ and a period for readout of signal charge (readout period) $T_{ro}$. With focus on one pixel, during the accumulation period $T_{acc}$, the drive signal $S_D$ with a plurality of pulses is applied to the light source and, in synchronism therewith, the charge transfer signals $S_1$, $S_2$ with the phases reverse to each other are applied to the first and second transfer electrodes TX1, TX2. Prior to the range measurement, a reset signal reset is applied to the third semiconductor regions 9a, 9b to discharge charge accumulated inside, to the outside. In the present example, the reset signal reset is instantaneously turned on and then turned off, and thereafter a plurality of drive oscillating pulses are sequentially applied. Furthermore, in synchronism therewith, the charge transfer is sequentially carried out to integrally accumulate signal charges in the third semiconductor regions 9a, 9b.

Thereafter, the signal charges accumulated in the third semiconductor regions 9a, 9b are read out in the readout period $T_{ro}$. At this time, the charge transfer signal $S_3$ applied to the third transfer electrodes TX3 is turned on to apply the positive potential to the third transfer electrodes TX3, whereby the unnecessary charge is collected into the potential wells of the fourth semiconductor regions 11a, 11b.

Figure 9:
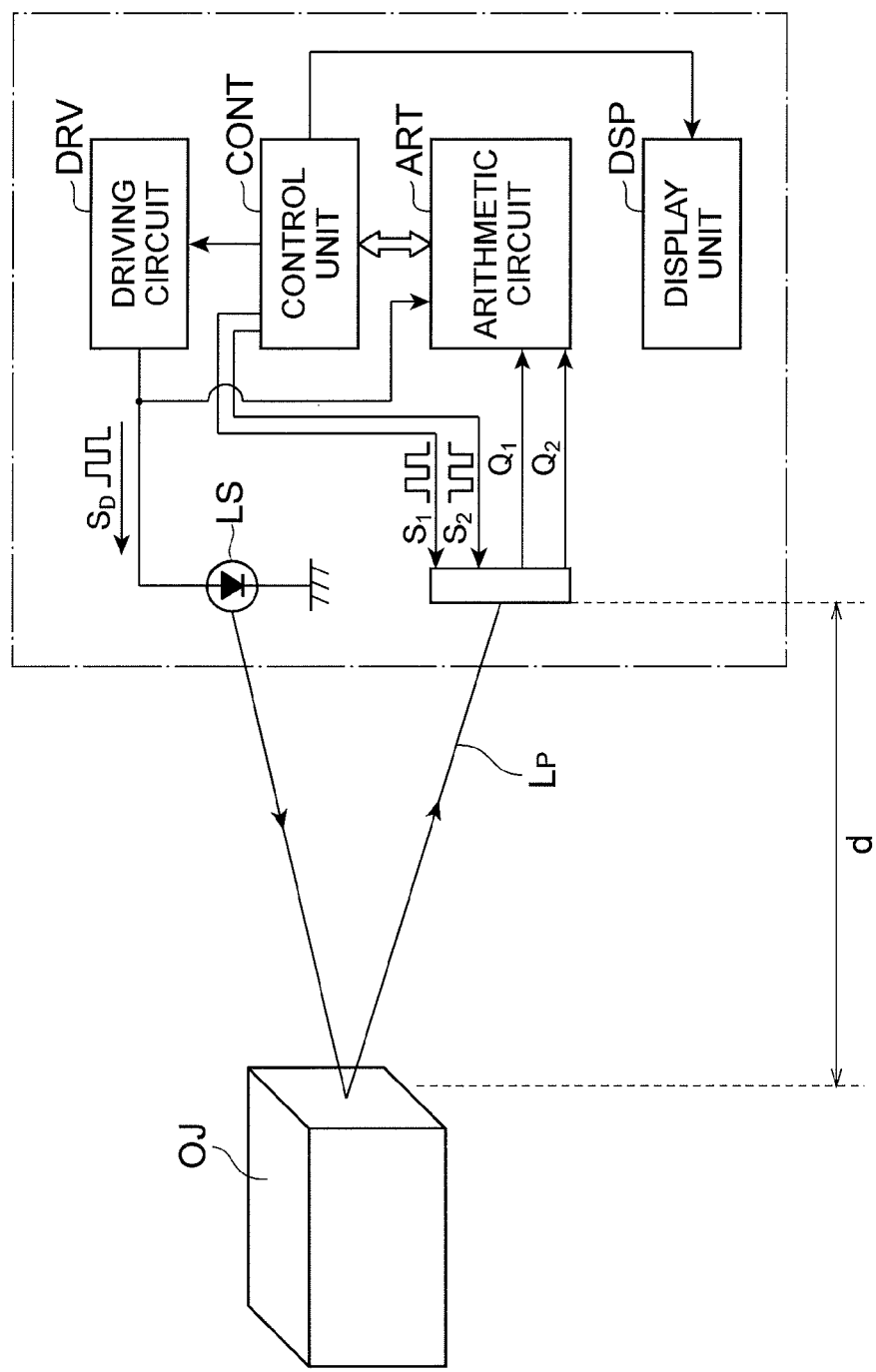
FIG. 9 is a drawing showing an overall configuration of a range image measuring device.

FIG. 9 is a drawing showing an overall configuration of a range image measuring device.

A distance d to an object OJ is measured by the range image measuring device. As described above, the drive signal $S_D$ is applied to the light source LS such as an LED, and the intensity signal $L_P$ of a reflected light image reflected by the object OJ is incident into the photosensitive region of the range image sensor RS. The range image sensor RS outputs the charge quantities $Q_1$, $Q_2$ collected in synchronism with the charge transfer signals $S_1$, $S_2$, on a pixel-by-pixel basis, and they are fed to an arithmetic circuit ART in synchronism with the drive signal $S_D$. The arithmetic circuit ART calculates the distance d on a pixel-by-pixel basis as described above and transfers the calculation result to a control unit CONT. The control unit CONT controls a driving circuit DRV to drive the light source LS, outputs the charge transfer signals $S_1$, $S_2$, $S_3$, and displays the calculation result input from the arithmetic circuit ART, on a display unit DSP.

Figure 10:
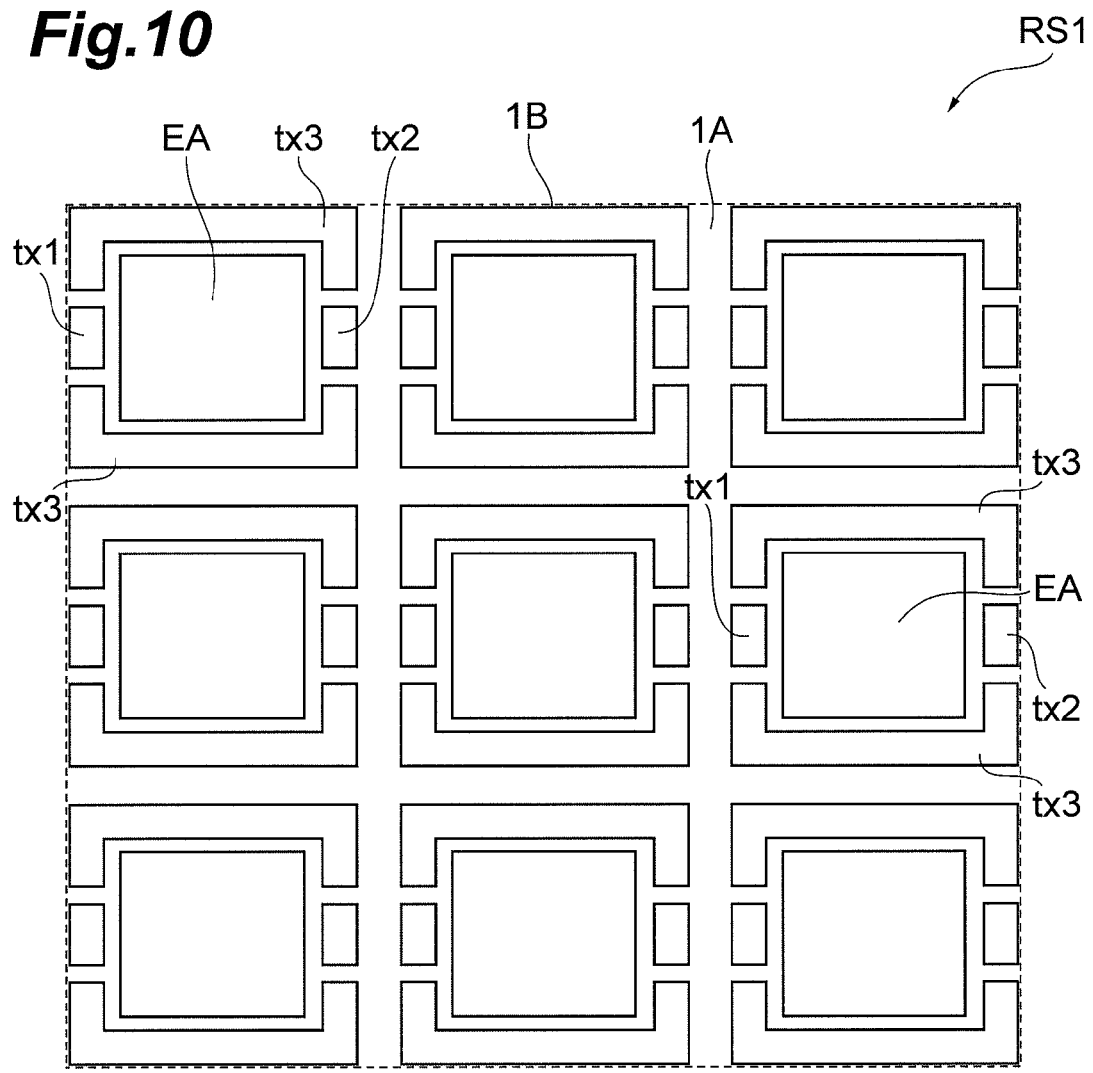
FIG. 10 is a schematic plan view of an imaging region in a conventional range image sensor.

FIG. 10 is a schematic plan view of an imaging region of a conventional range image sensor.

In the range image sensor RS1, as shown in FIG. 10, one pixel (range sensor) is composed of a rectangular charge generating region EA, transfer gate electrodes tx1, tx2 (corresponding to the first and second transfer electrodes TX1, TX2) provided respectively along a pair of two opposed sides of the charge generating region EA, floating drain regions (not shown) for accumulating respective signal charges transferred by the transfer gate electrodes tx1, tx2, discharge gate electrodes tx3 (corresponding to the third transfer electrodes TX3) provided respectively along a different pair of two opposed sides of the charge generating region, and discharge drain regions (not shown) for accepting respective background light charges discharged by the discharge gate electrodes tx3.

In the above range image sensor RS1, the semiconductor substrate 1A has the imaging region 1B consisting of nine pixels arrayed in a matrix of three rows and three columns (3×3). In this range image sensor RS1, the U-shaped discharge gate electrodes tx3 are arranged so as to surround the perimeter of the charge generating region EA (with the charge generating region EA in between in the vertical direction in the drawing), which raises a problem of a low aperture ratio.

In contrast to it, in the range image sensor RS according to the present invention, the third semiconductor regions 9a, 9b are arranged opposite to each other with the photogate electrode PG (photosensitive region) in between in the direction in which the first and second long sides L1, L2 are opposed to each other and the first and second transfer electrodes TX1, TX2 are provided respectively between the third semiconductor regions 9a, 9b and the photogate electrode PG. Furthermore, the fourth semiconductor regions 11a are arranged so as to be spatially separated from each other on the side where the first long side L1 exists and along the first long side L1 and so as to be located on either side of the third semiconductor region 9a, the fourth semiconductor regions 11a are arranged opposite to the fourth semiconductor regions 11a, and the third transfer electrodes TX3 are provided respectively between the fourth semiconductor regions 11a, 11b and the photogate electrode PG.

Since no electrode is arranged in the direction in which the first and second short sides S1, S2 are opposed to each other, this configuration remarkably improves the aperture ratio, when compared to the conventional configuration wherein the third transfer electrodes TX3 are arranged so as to partly surround the photogate electrode PG.

In the aforementioned configuration, the signal charge and unnecessary charge generated in the photosensitive region are transferred in the direction in which the first and second long sides L1, L2 are opposed to each other, by the first to third transfer electrodes TX1-TX3. For this reason, the distance in the direction in which the first and second long sides L1, L2 are opposed is kept constant even if the photogate electrode PG is formed in an extended size in the direction in which the first and second short sides S1, S2 are opposed. This ensures a sufficient transfer speed of charge in the first to third transfer electrodes TX1-TX3. Accordingly, the aperture ratio is improved while ensuring the sufficient transfer speed. As a consequence, a range image can be obtained with a high S/N ratio.

Figure 11:
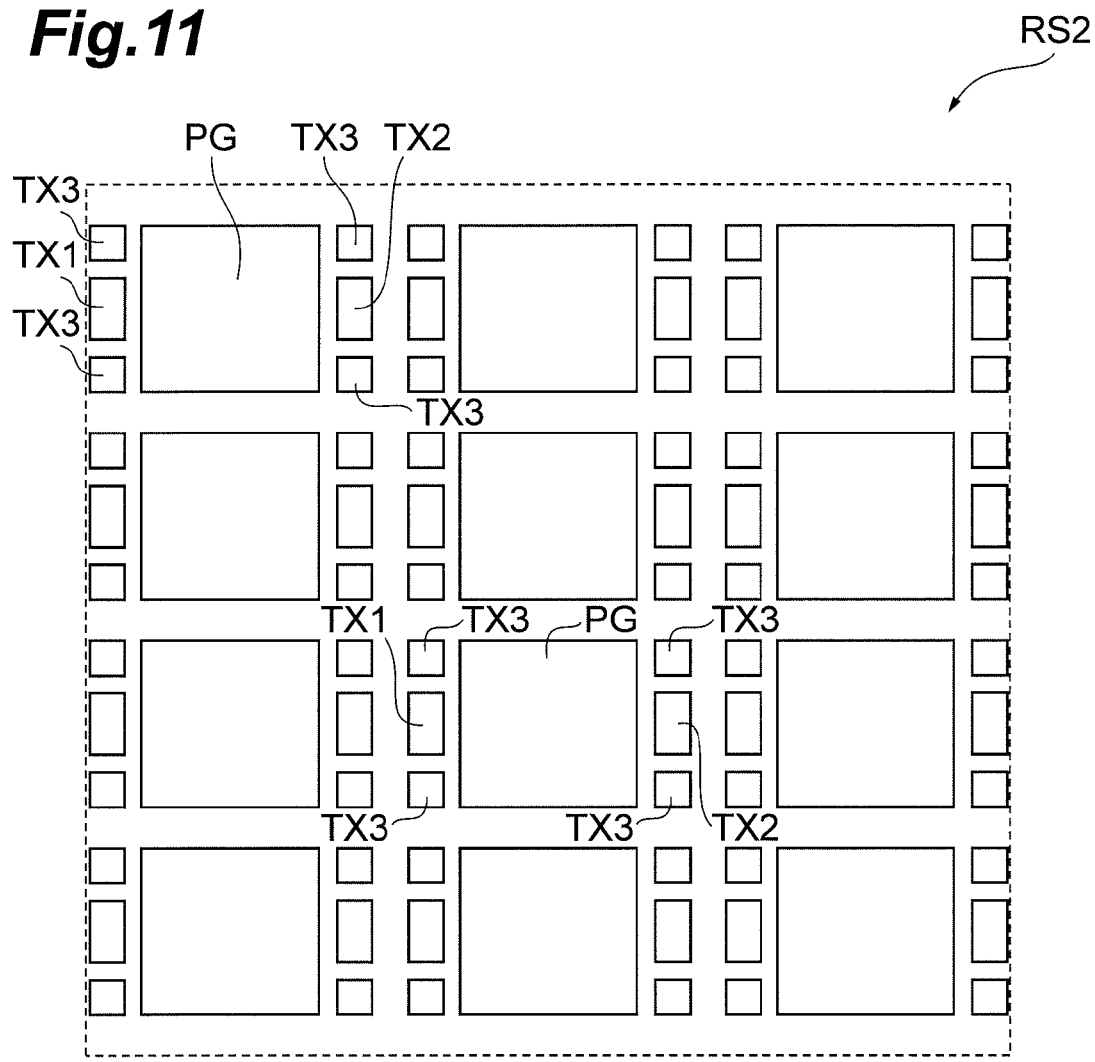
FIG. 11 is a schematic plan view showing an example of the imaging region in the range image sensor of the present invention.

In the range image sensor RS, the third transfer electrodes TX3 are not arranged in the direction in which the first and second long sides L1, L2 of the photogate electrode PG are opposed to each other, but the plurality of third transfer electrodes TX3 are arranged as separated along the first and second long sides L1, L2. For this reason, the area of the third transfer electrodes TX3 can be made smaller than that of the discharge gate electrodes tx3 shown in FIG. 10. The pixels in the range image sensor RS can have the pixel area smaller than that of the pixels in the conventional range image sensor RS1. Therefore, only three rows and three columns of pixels can be arrayed on the semiconductor substrate 1B in the range image sensor RS1, whereas in the range image sensor RS of the present invention, as shown in FIG. 11, the pixels can be arrayed in a matrix of three rows and four columns (3×4) on the semiconductor substrate having the same area (region enclosed by a dotted line) as the semiconductor substrate 1B of the range image sensor RS1. The range image sensor RS has the remarkably improved aperture ratio, when compared to the conventional range image sensor RS1.

The gate width of the first and second transfer electrodes TX1, TX2 is longer than the gate width of the third transfer electrodes TX3. This improves the transfer speed of signal charge in the first and second transfer electrodes TX1, TX2.

The outside edges TX3a of the third transfer electrodes TX3 in the opposed direction of the first and second short sides S1, S2 are approximately flush with the two edges PGa, PGb of the photogate electrode PG in the opposed direction of the first and second short sides S1, S2. This allows the photogate electrodes PG to be arranged in proximity to each other in the opposed direction of the first and second short sides S1, S2.

Figure 12:
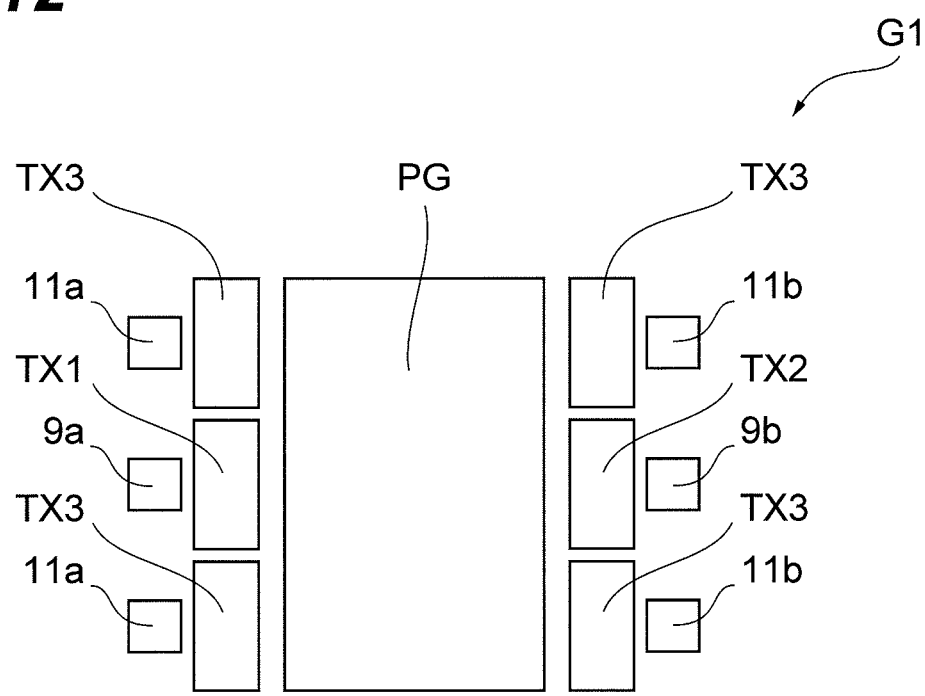
FIG. 12 is a schematic plan view of a pixel forming the imaging region of the range image sensor according to a modification example.

The present invention is by no means limited to the above embodiment. For example, in the above embodiment the gate width of the first and second transfer electrodes TX1, TX2 is set larger than that of the third transfer electrodes TX3, but the present invention does not have to be limited to it. For example, like the pixel G1 shown in FIG. 12, the first to third transfer electrodes TX1-TX3 may be formed in the same shape so that the gate width of the first and second transfer electrodes TX1, TX2 becomes equal to that of the third transfer electrodes TX3. The range image sensor with pixels G1 of this configuration can also achieve the same action and effect as the aforementioned range image sensor RS.

Figure 13:
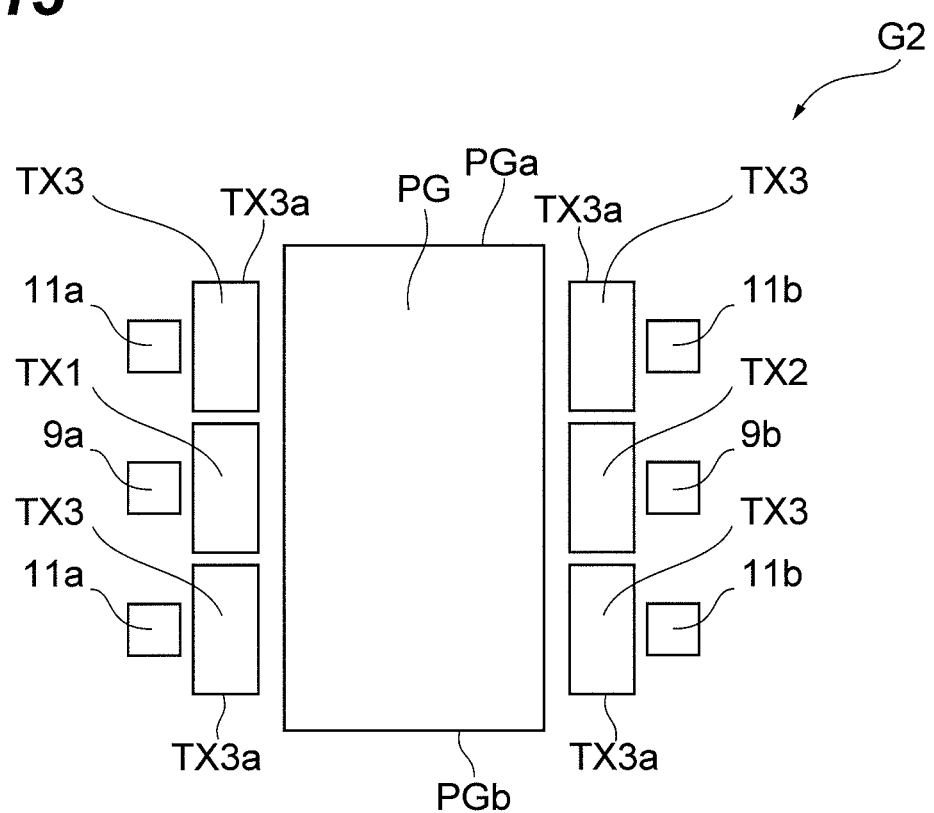
FIG. 13 is a schematic plan view of a pixel forming the imaging region of the range image sensor according to a modification example.
Figure 14:
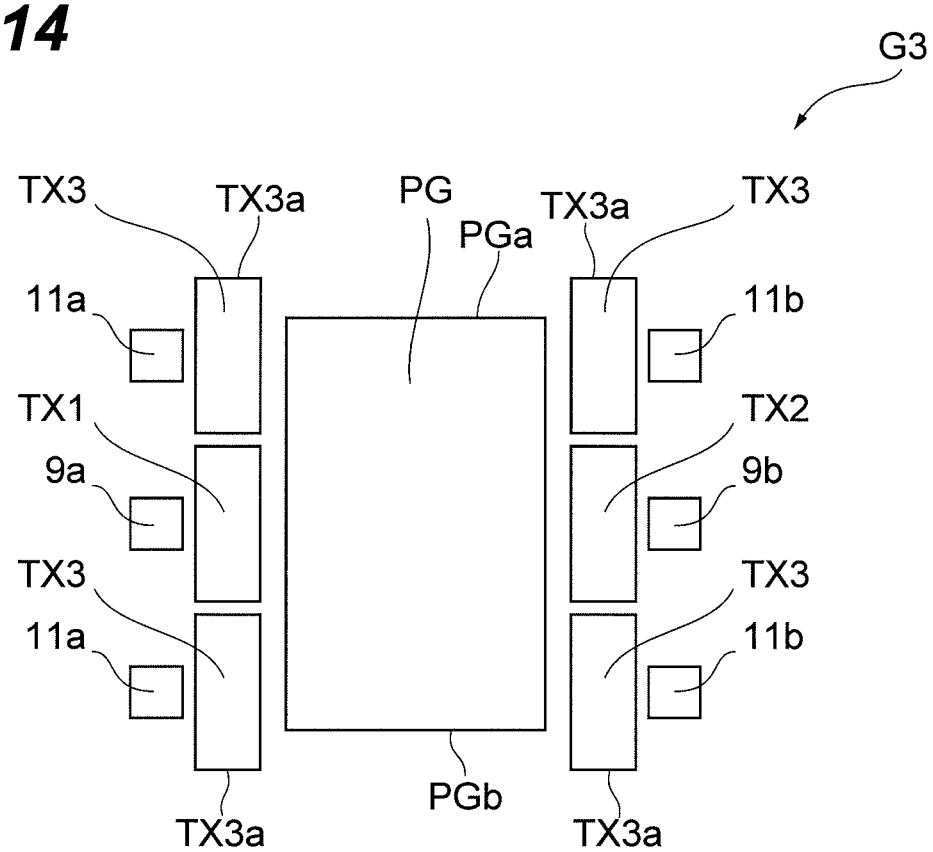
FIG. 14 is a schematic plan view of a pixel forming the imaging region of the range image sensor according to a modification example.

In the above embodiment, the outside edges TX3a of the third transfer electrodes TX3 in the opposed direction of the first and second short sides S1, S2 of the photogate electrode PG are approximately flush with the two edges PGa, PGb of the photogate electrode PG in the opposed direction of the first and second short sides S1, S2, but the range image sensor may be configured in configurations as shown in FIGS. 13 and 14.

In the pixel G2, as shown in FIG. 13, the two edges PGa, PGb of the photogate electrode PG in the opposed direction of the first and second short sides S1, S2 are more projecting to the outside than the outside edges TX3a of the third transfer electrodes TX3 in the opposed direction of the first and second short sides S1, S2 of the photogate electrode PG. In other words, the outside edges TX3a of the third transfer electrodes TX3 in the opposed direction of the first and second short sides S1, S2 of the photogate electrode PG are located on the inside of the two edges PGa, PGb of the photogate electrode PG in the opposed direction of the first and second short sides S1, S2 of the photogate electrode PG The range image sensor with pixels G2 of this configuration can also achieve the same action and effect as the aforementioned range image sensor RS.

In the pixel G3, as shown in FIG. 14, the outside edges TX3a of the third transfer electrodes TX3 in the opposed direction of the first and second short sides S1, S2 of the photogate electrode PG are more projecting to the outside than the two edges PGa, PGb of the photogate electrode PG in the opposed direction of the first and second short sides S1, S2. The range image sensor with pixels G3 of this configuration can also achieve the same operation and effect as the aforementioned range image sensor RS.

Figure 15:
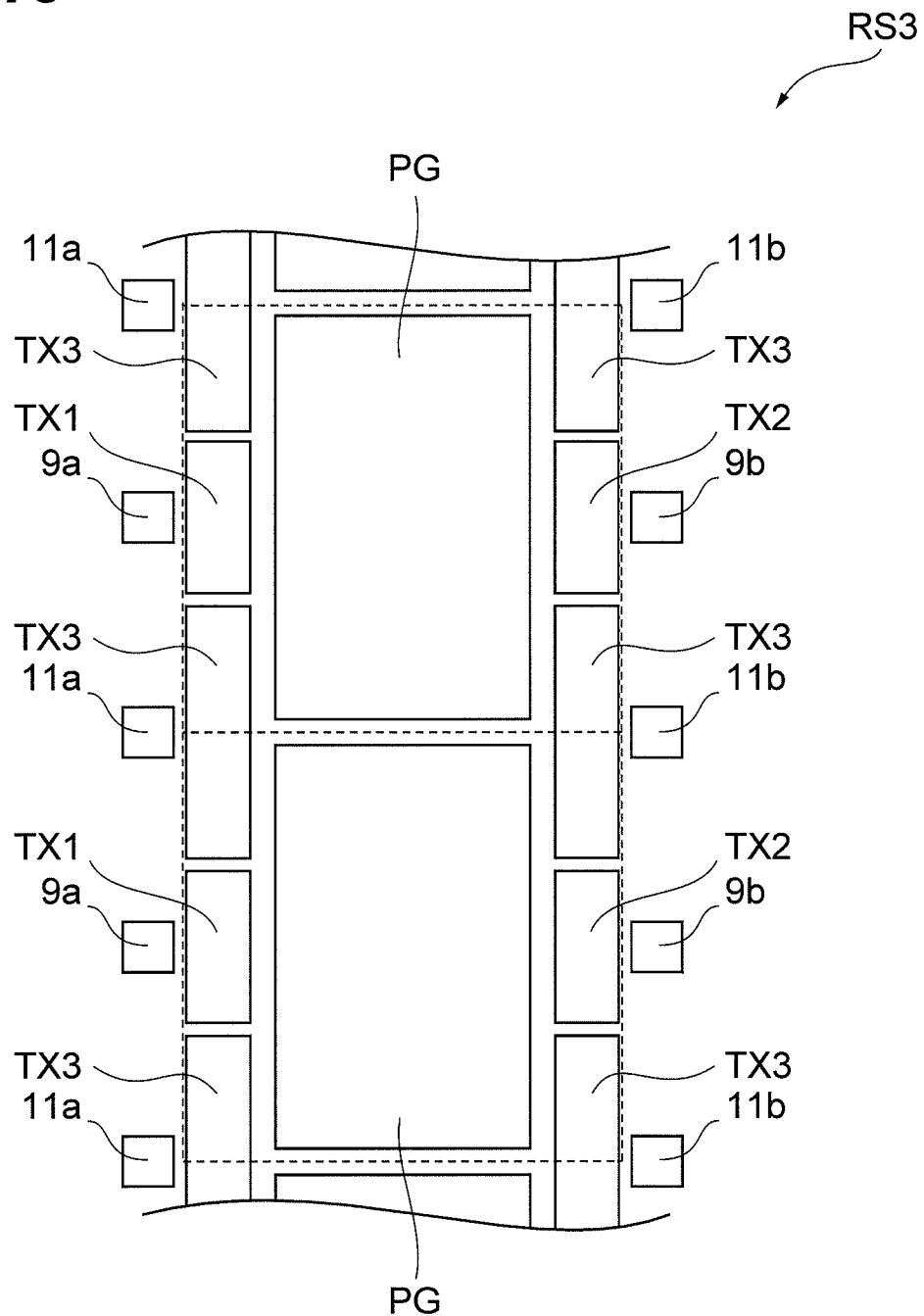
FIG. 15 is a schematic plan view of the imaging region in the range image sensor according to a modification example.

The above embodiment shows the configuration wherein one pixel (range sensor) in the range image sensor RS is composed of one photogate electrode PG, the region corresponding to the photogate electrode PG in the semiconductor substrate 1, a pair of first transfer electrode TX1 and second transfer electrode TX2, a pair of third semiconductor regions 9a, 9b, two pairs of third transfer electrodes TX3, and two pairs of fourth semiconductor regions 11a, 11b, but the range image sensor may be constructed, for example, in a configuration as shown in FIG. 15.

In the range image sensor RS3, as shown in FIG. 15, a portion enclosed in a dotted line indicates one pixel. In the range image sensor RS3, like the range image sensor RS, one pixel is composed of one photogate electrode PG, the region corresponding to the photogate electrode PG in the semiconductor substrate 1, a pair of first transfer electrode TX1 and second transfer electrode TX2, a pair of third semiconductor regions 9a, 9b, two pairs of third transfer electrodes TX3, and two pairs of fourth semiconductor regions 11a, 11b. The two pairs of third transfer electrodes TX3 and two pairs of fourth semiconductor regions 11a, 11b also form the other neighboring pixels. Namely, each third transfer electrode TX3 is arranged across a boundary between two adjacent photogate electrodes PG, PG so that the edges TX3a of the third transfer electrode TX3 are more projecting to the outside than the two edges PGa, PGb of the photogate electrode PG, as shown in FIG. 14. The fourth semiconductor regions 11a, 11b are arranged at the boundary between the photogate electrodes PG, PG, corresponding to the third transfer electrodes TX3. In the range image sensor RS3, therefore, one pixel is configured by sharing the third transfer electrodes TX3 and the fourth semiconductor regions 11a, 11b. This configuration can simplify manufacture of pixels in the range image sensor.

Figure 16:
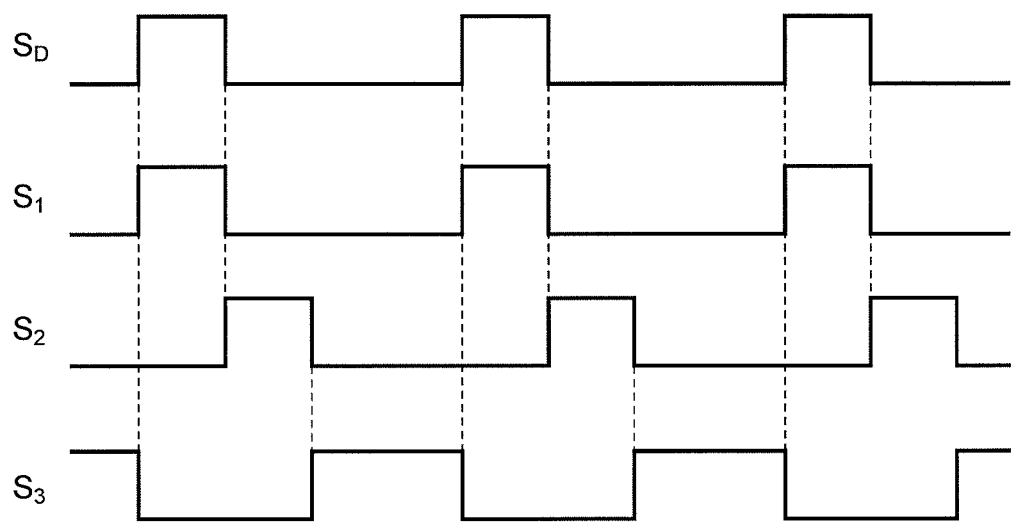
FIG. 16 is a timing chart of various signals according to the modification example.

FIG. 16 is a timing chart of various signals according to a modification example.

In the present modification example, the drive signal $S_D$ has an increased duty ratio (on time per unit time), when compared to the aforementioned embodiment. This increases the drive power of the light source LS (cf. FIG. 9), so as to further improve the SN ratio. In the present modification example, one pulse for each of the first to third transfer electrodes TX1-TX3 is generated per pulse of the drive signal $S_D$. This improves the range detection accuracy, while discharging the unnecessary charge, even in the case where the drive power of the light source LS is increased. Of course, the aperture ratio is also improved.

Figure 17:
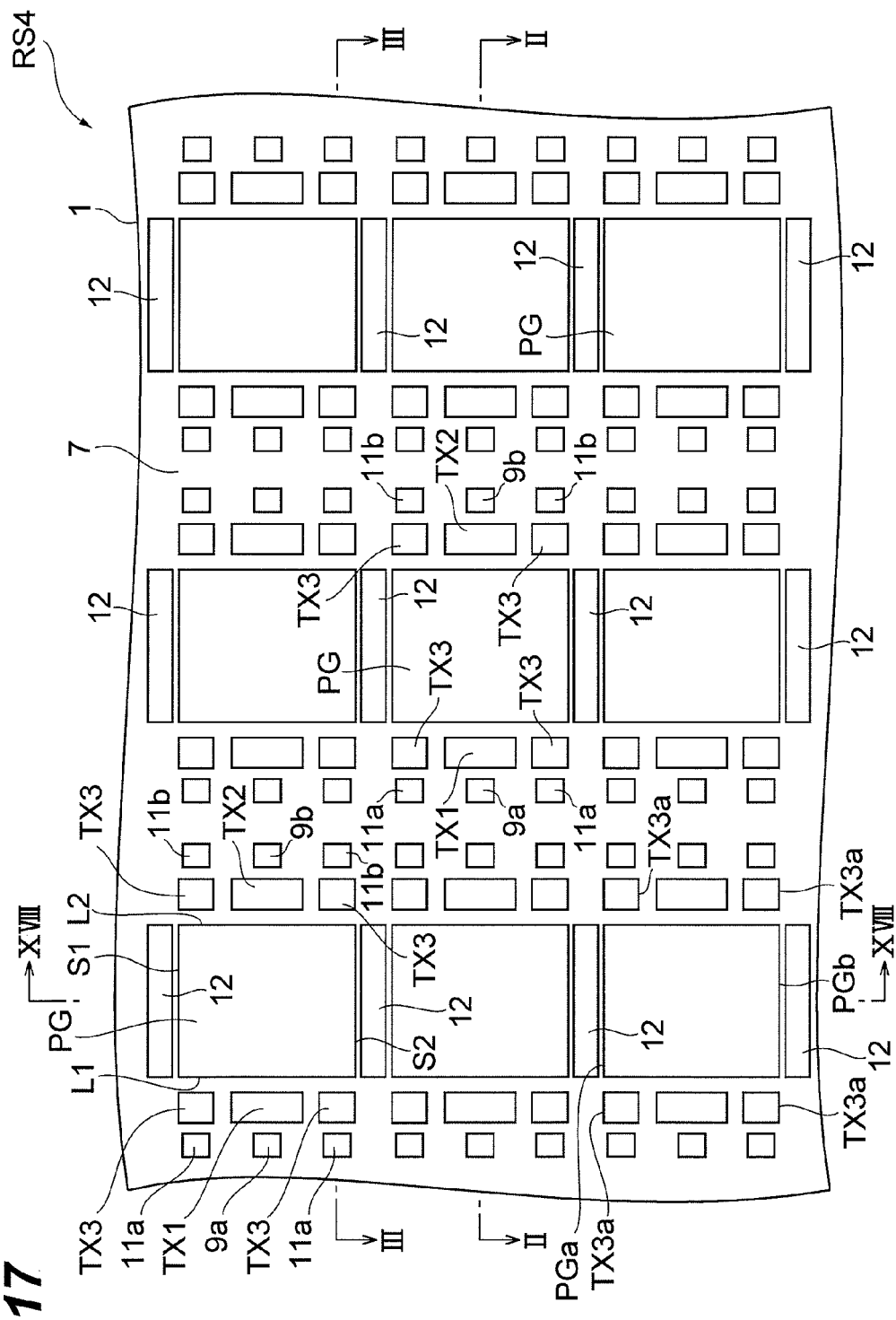
FIG. 17 is a schematic plan view of the imaging region in the range image sensor according to a modification example of the embodiment.
Figure 18:
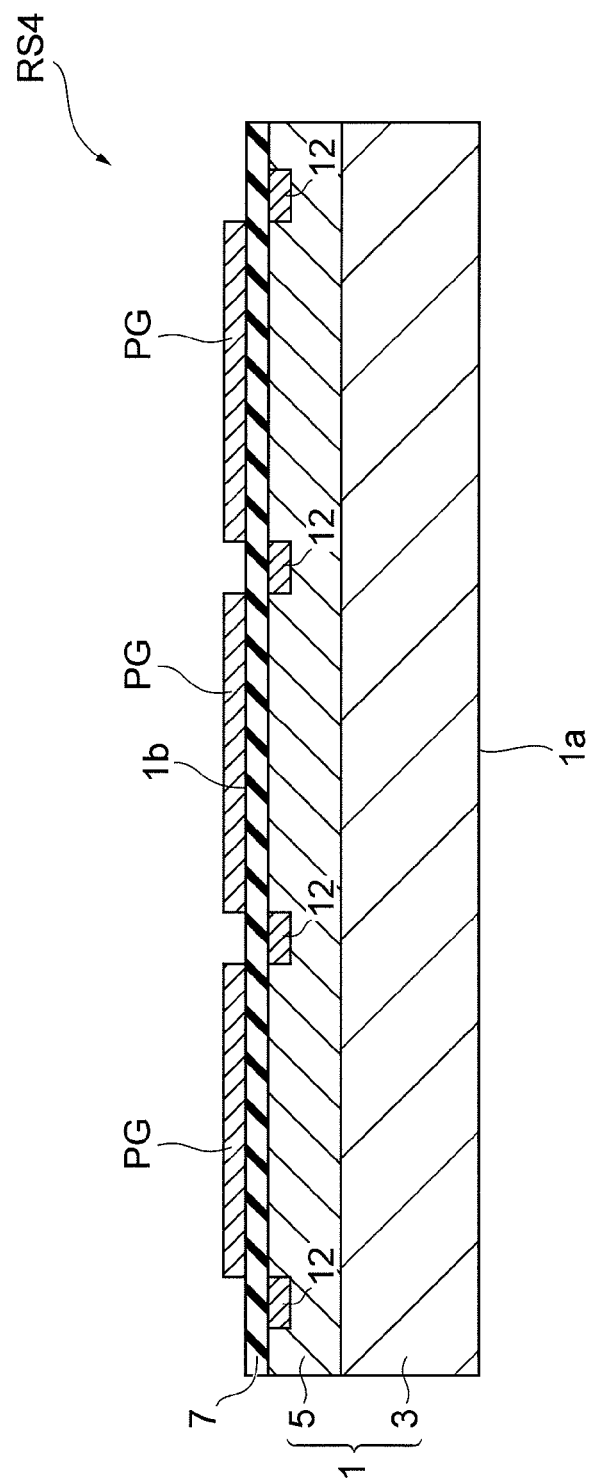
FIG. 18 is a drawing showing a cross-sectional configuration of the imaging region along the line XVIII-XVIII.

A further modification example will be described below with reference to FIGS. 17 and 18. FIG. 17 is a schematic plan view of the imaging region of the range image sensor according to the present modification example. FIG. 18 is a drawing showing a cross-sectional configuration of the imaging region along the line XVIII-XVIII. The range image sensor RS4 of the present modification example is different from the aforementioned range image sensor RS in that it is provided with fifth semiconductor regions 12.

The fifth semiconductor regions 12 are arranged respectively along the first and second short sides S1, S2, on the sides where the first and second short sides S1, S2 of the photogate electrodes PG exist. Namely, the fifth semiconductor regions 12 are arranged opposite to each other with the photogate electrode PG (photosensitive region) in between in the direction in which the first and second short sides S1, S2 are opposed to each other. The fifth semiconductor regions 12 have a rectangular shape on the plan view. In the present embodiment, the fifth semiconductor regions 12 have a rectangle shape having the long-side direction parallel to the direction in which the first and second long sides L1, L2 are opposed to each other.

The fifth semiconductor regions 12 are regions having the same conductivity type as the semiconductor substrate 1A and an impurity concentration higher than that of the semiconductor substrate 1A, i.e., regions comprised of a p-type semiconductor with a high impurity concentration. The fifth semiconductor regions 12 may be p-type well regions or may be p-type diffusion regions. The thickness/impurity concentration of the fifth semiconductor regions 12 are as described below.

Figure 19:
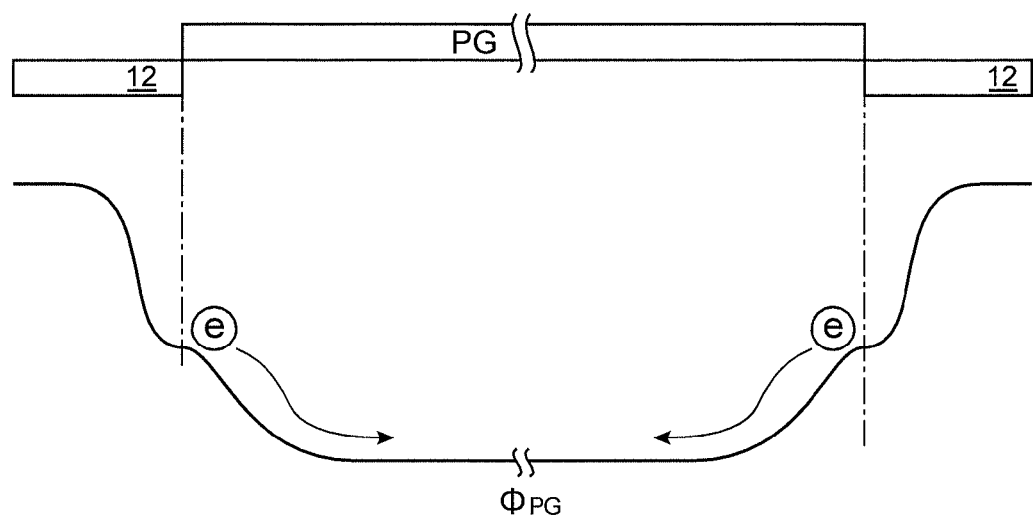
FIG. 19 is a drawing showing a potential profile near the second principal surface of the semiconductor substrate.

Fifth semiconductor regions 12: thickness 1-5 μm/impurity concentration $1 \times 10^{16}$-$10^{18}$ cm$^{-3}$ Since the fifth semiconductor regions 12 are arranged in the present modification example, the potential $\Phi_{PG}$ of the region immediately below the photogate electrode PG is raised on the sides where the first and second short sides S1, S2 exist, as shown in FIG. 19. Therefore, a potential gradient decreasing from the first and second short sides S1, S2 toward the region located between the third semiconductor regions 9a, 9b is formed in the region immediately below the photogate electrode PG.

Charges generated near the first and second short sides S1, S2 in the region immediately below the photogate electrode PG are accelerated according to the foregoing potential gradient formed by the fifth semiconductor regions 12, so as to quickly migrate toward the region located between the third semiconductor regions 9a, 9b. Then the charges having migrated are transferred according to the potential gradient formed by an electric field of the first transfer electrode TX1 and the third semiconductor region 9a or according to the potential gradient formed by an electric field of the second transfer electrode TX2 and the third semiconductor region 9b to be accumulated in the potential well of the third semiconductor region 9a or in the potential well of the third semiconductor region 9b, as in the above range image sensor RS.

In the present modification example, as described above, the planar shape of the photogate electrodes PG is set in the rectangle shape. This can increase the transfer speed of charge toward the third semiconductor regions 9a, 9b, while achieving enhancement of sensitivity of the range image sensor RS4 with increase in the area of the region (photosensitive region) immediately below the photogate electrode PG.

In the present modification example, the length of the third semiconductor regions 9a, 9b in the opposed direction of the first and second short sides SS1, SS2 is set extremely smaller than the length of the photogate electrode PG in the opposed direction of the first and second short sides S1, S2 and the area of the third semiconductor regions 9a, 9b is also set smaller than the area of the photogate electrode PG. For this reason, the area of the third semiconductor regions 9a, 9b is largely reduced, relative to the area of the region available for transfer of charge to the third semiconductor regions 9a, 9b, in the region (photosensitive region) immediately below the photogate electrode PG The charges (charge quantities Q1, Q2) accumulated after transferred to the third semiconductor regions 9a, 9b generate respective voltage changes (ΔV) represented by the formulae below, based on the capacitance of the third semiconductor regions 9a, 9b (Cfd).

$$\Delta V = Q1/Cfd$$

$$\Delta V = Q2/Cfd$$

Therefore, the decrease in the area of the third semiconductor regions 9a, 9b leads to a decrease in the capacitance (Cfd) of the third semiconductor regions 9a, 9b and thus to an increase in the generated voltage changes (ΔV). Namely, it results in an increase in charge-voltage conversion gain. This also allows achievement of higher sensitivity of the range image sensor RS4.

Incidentally, in the present modification example, the fifth semiconductor regions 12 make the potential of the region (photosensitive region) immediately below the photogate electrode PG on the sides where the first and second short sides S1, S2 exist, higher than the potential in the region located between the first and second semiconductor regions FD1, FD2, so as to form the potential gradient decreasing toward the region located between the third semiconductor regions 9a, 9b. For this reason, the charges generated near the first and second short sides S1, S2 in the region immediately below the photogate electrode PG become easier to migrate in the opposed direction of the first and second short sides S1, S2 toward the region located between the third semiconductor regions 9a, 9b, according to the aforementioned potential gradient. The charges having migrated in the opposed direction of the first and second short sides S1, S2 from the sides where the first and second short sides S1, S2 exist toward the region located between the third semiconductor regions 9a, 9b are quickly transferred by the electric field established by the first transfer electrode TX1 and the third semiconductor region 9a or by the electric field established by the second transfer electrode TX2 and the third semiconductor region 9b. Therefore, the charge generated in the region immediately below the photogate electrode PG can be quickly transferred even in the sensitivity-improved configuration by setting the planar shape of the photogate electrode PG (photosensitive region) to the rectangle shape so as to increase the area and by setting the area of the third semiconductor regions 9a, 9b to the extremely small area.

In the present embodiment, the fifth semiconductor regions 12 are formed by adjusting the impurity concentration of the semiconductor substrate 1. For this reason, it is feasible to readily realize the configuration wherein the potential on the sides where the first and second short sides S1, S2 exist, in the region immediately below the photogate electrode PG is made higher than the potential in the region located between the third semiconductor regions 9a, 9b.

Figure 20:
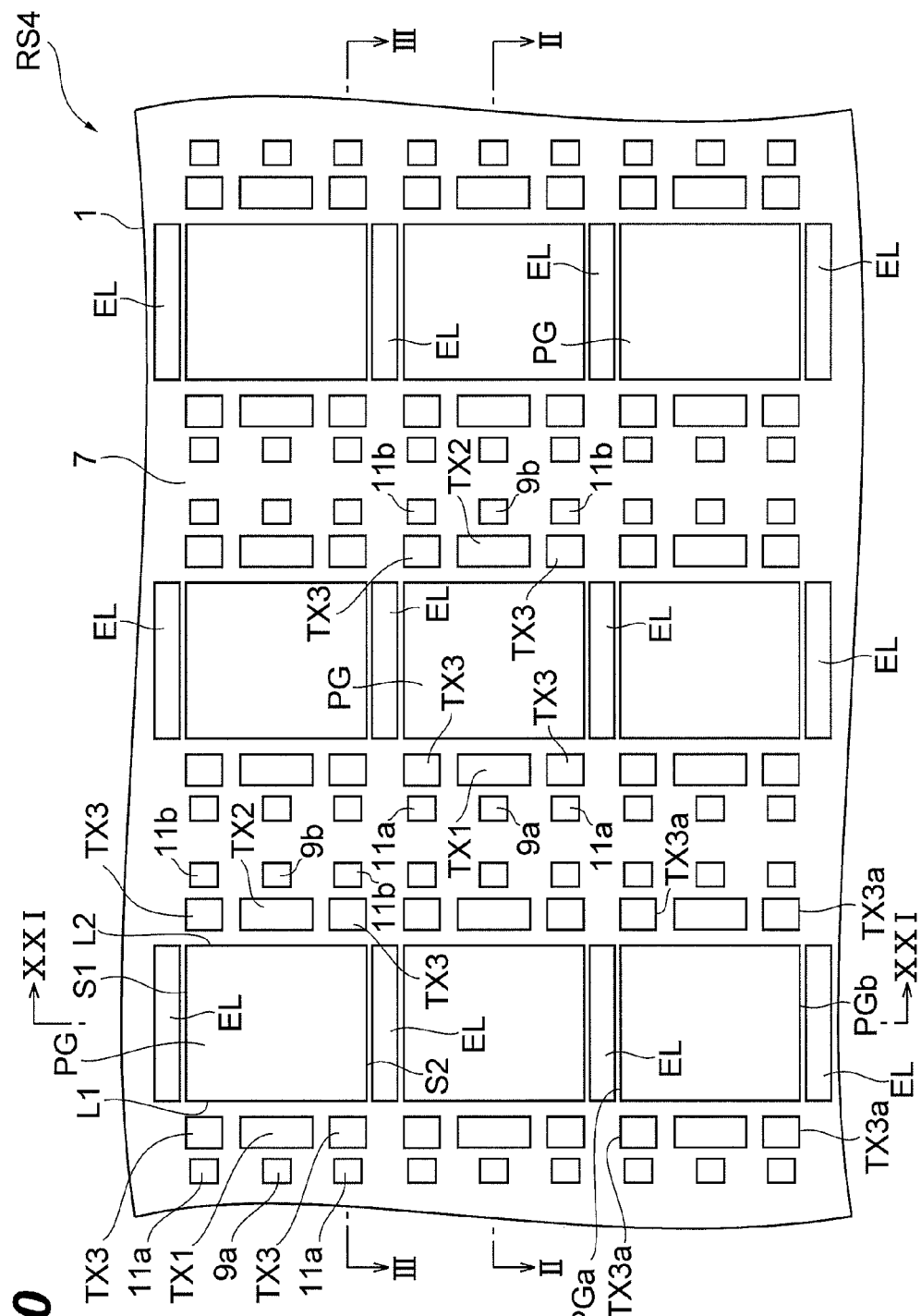
FIG. 20 is a schematic plan view of the imaging region in the range image sensor according to a modification example of the embodiment.
Figure 21:
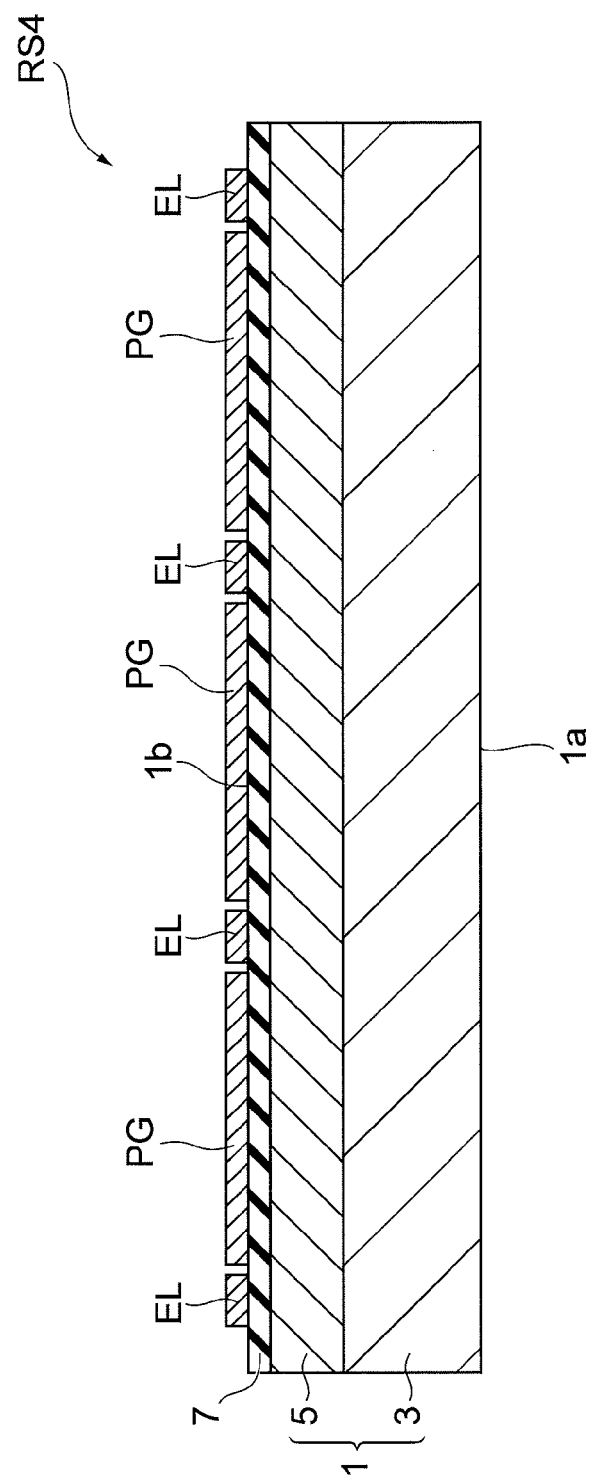
FIG. 21 is a drawing showing a cross-sectional configuration of the imaging region along the line XXI-XXI.

Next, a modification example of the range image sensor RS4 will be described with reference to FIGS. 20 and 21. FIG. 20 is a schematic plan view of the imaging region of the range image sensor according to the present modification example. FIG. 21 is a drawing showing a cross-sectional configuration of the imaging region along the line XXI-XXI. The present modification example is different from the aforementioned modification example in which it is provided with potential adjusting electrodes EL, instead of the fifth semiconductor regions 12.

The potential adjusting electrodes EL are arranged respectively along the first and second short sides S1, S2, on the sides where the first and second short sides S1, S2 of the photogate electrode PG exist. Namely, the potential adjusting electrodes EL are arranged opposite to each other with the photogate electrode PG (photosensitive region) in between in the direction in which the first and second short sides S1, S2 are opposed to each other.

The potential adjusting electrodes EL have a rectangular shape on the plan view. In the present embodiment, the potential adjusting electrodes EL have a rectangle shape having the long-side direction parallel to the direction in which the first and second long sides L1, L2 are opposed to each other. The length of the potential adjusting electrodes EL in the opposed direction of the first and second long sides L1, L2 is set, for example, to about the length of the first and second short sides S1, S2 of the photogate electrode PG. The potential adjusting electrodes EL are comprised of polysilicon but these may be comprised of another material different from it.

Figure 22:
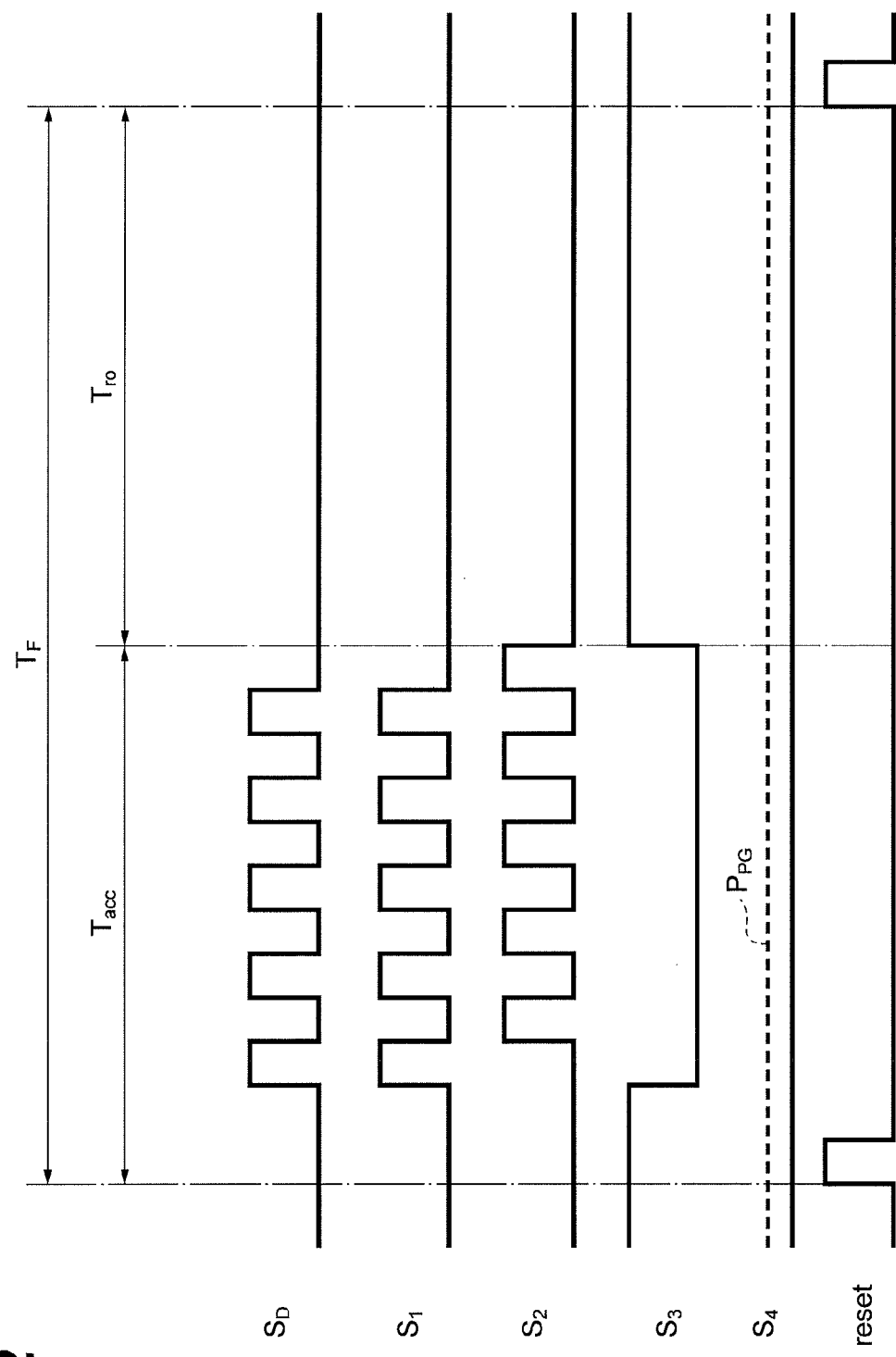
FIG. 22 is a timing chart of various signals.

The potential adjusting electrodes EL are given a potential lower than the potential ($P_{PG}$) given to the photogate electrodes PG, by a potential adjustment signal $S_4$, as shown in FIG. 22. FIG. 22 is a timing chart of actual various signals, in which the signals other than the potential adjustment signal $S_4$ are the same as the signals shown in FIG. 8. The potential adjustment signal $S_4$ is supplied from the control unit CONT.

Figure 23:
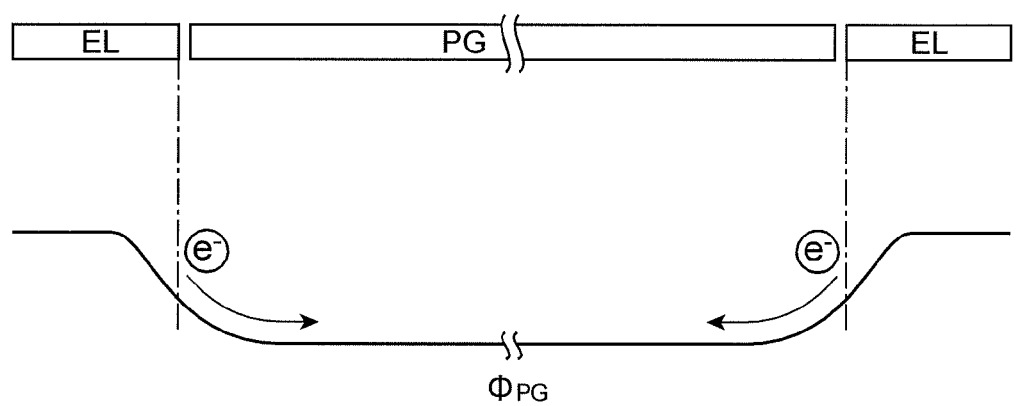
FIG. 23 is a drawing showing a potential profile near the second principal surface of the semiconductor substrate.

In the present modification example, since the potential adjusting electrodes EL are given the potential lower than the potential given to the photogate electrode PG, the potential $\Phi_{PG}$ of the region immediately below the photogate electrode PG is raised on the sides where the first and second short sides S1, S2 exist, as shown in FIG. 23. Therefore, a potential gradient decreasing from the sides where the first and second short sides S1, S2 exist, toward the region located between the third semiconductor regions 9a, 9b is formed in the region immediately below the photogate electrode PG.

Charges generated near the first and second short sides S1, S2 in the region immediately below the photogate electrode PG are accelerated according to the aforementioned potential gradient formed by the potential adjusting electrodes EL, so as to quickly migrate toward the region located between the third semiconductor regions 9a, 9b. Then the charges having migrated are transferred according to the potential gradient formed by the electric field of the first transfer electrode TX1 and the third semiconductor region 9a or according to the potential gradient formed by the electric field of the second transfer electrode TX2 and the third semiconductor region 9b to be accumulated in the potential well of the third semiconductor region 9a or in the potential well of the third semiconductor region 9b, as in the aforementioned embodiment.

As described above, in the present modification example, as in the above embodiment, the charge generated in the region immediately below the photogate electrode PG can also be quickly transferred even in the sensitivity-improved configuration by setting the planar shape of the photogate electrode PG (charge generating region) to the rectangle shape so as to increase the area and by setting the area of the third semiconductor regions 9a, 9b to the extremely small area.

In the present modification example, the potential adjusting electrodes EL make the potential on the sides where the first and second short sides S1, S2 exist, in the region immediately below the photogate electrode PG higher than the potential in the region located between the third semiconductor regions 9a, 9b. For this reason, it is feasible to readily realize the configuration wherein the potential on the sides where the first and second short sides S1, S2 exist, in the region immediately below the photogate electrode PG is made higher than the potential in the region located between the third semiconductor regions 9a, 9b.

In a further modification example, the photosensitive region where charge is generated according to incident light may be composed of a photodiode (e.g., a buried photodiode or the like). The range image sensors RS-RS4 may be front-illuminated range image sensors. The range image sensors RS-RS4 do not have to be limited to those with the pixels arrayed in a two-dimensional pattern, but may be those with pixels arrayed in a one-dimensional pattern.

The length of the fifth semiconductor regions 12 and the potential adjusting electrodes EL in the opposed direction of the first and second long sides L1, L2 may be set shorter, for example, than the length of the first and second short sides S1, S2 as long as the potential on the sides where the first and second short sides S1, S2 exist, in the region immediately below the photogate electrode PG can be made higher than the potential in the region located between the third semiconductor regions 9a, 9b.

INDUSTRIAL APPLICABILITY

The present invention is applicable to the range sensors and range image sensors mounted on product monitors in manufacture lines in factories, vehicles, and so on.

LIST OF REFERENCE SIGNS 9a, 9b third semiconductor regions (signal charge collecting regions); 11a, 11b fourth semiconductor regions (first unnecessary charge collecting regions and second unnecessary charge collecting regions); 12 fifth semiconductor regions; EL potential adjusting electrodes; L1 first long side; L2 second long side; PG photogate electrodes; PGa, PGb two edges; RS, RS2, RS3 range image sensors; S1 first short side; S2 second short side; $S_1$, $S_2$ charge transfer signals; TX1 first transfer electrodes; TX2 second transfer electrodes; TX3 third transfer electrodes (unnecessary charge collecting gate electrodes); TX3a edges.

The invention claimed is:

1. A range sensor comprising:
a photosensitive region which generates charge according to incident light and which has a planar shape having first and second long sides opposed to each other and first and second short sides opposed to each other;
a plurality of signal charge collecting regions which are arranged opposite to each other with the photosensitive region in between in a direction in which the first and second long sides are opposed to each other and which collect signal charges from the photosensitive region;
a plurality of transfer electrodes which are given respective charge transfer signals of different phases and which are provided respectively between the plurality of signal charge collecting regions and the photosensitive region;
a plurality of first unnecessary charge collecting regions which are arranged as spatially separated from each other so as to be located on either side of the signal charge collecting region on the side where the first long side exists and along the first long side and which collect unnecessary charge from the photosensitive region;
a plurality of second unnecessary charge collecting regions which are arranged as spatially separated from each other so as to be opposed to the plurality of first unnecessary charge collecting regions with the photosensitive region in between in the direction in which the first and second long sides are opposed to each other and so as to be located on either side of the signal charge collecting region on the side where the second long side exists and along the second long side, and which collect unnecessary charge from the photosensitive region;
a plurality of unnecessary charge collecting gate electrodes which are provided respectively between the plurality of first and second unnecessary charge collecting regions and the photosensitive region and which selectively perform closing and opening of flow of unnecessary charge from the photosensitive region to the first and second unnecessary charge collecting regions; and
the plurality of first unnecessary charge collecting regions and the plurality of second unnecessary charge collecting regions directly discharge a part of the charge generated in the photosensitive region as the unnecessary charge through regions immediately below the plurality of unnecessary charge collecting gate electrodes.

2. The range sensor according to claim 1,
wherein a length of the transfer electrodes in a direction along the first and second long sides is larger than a length of the unnecessary charge collecting gate electrodes in the direction along the first and second long sides.

3. The range sensor according to claim 1,
wherein outside edges of the unnecessary charge collecting gate electrodes in a direction in which the first and second short sides are opposed to each other are substantially flush with two edges of the photosensitive region in the direction in which the first and second short sides are opposed to each other.

4. The range sensor according to claim 1,
wherein outside edges of the unnecessary charge collecting gate electrodes in a direction in which the first and second short sides are opposed to each other are located on the inside of two edges of the photosensitive region in the direction in which the first and second short sides are opposed to each other.

5. The range sensor according to claim 1,
wherein outside edges of the unnecessary charge collecting gate electrodes in a direction in which the first and second short sides are opposed to each other project to the outside beyond two edges of the photosensitive region in the direction in which the first and second short sides are opposed to each other.

6. The range sensor according to claim 1, further comprising:
a plurality of potential adjusting means which are arranged opposite to each other with the photosensitive region in between in a direction in which the first and second short sides are opposed to each other, and which make a potential of the photosensitive region on the sides where the first and second short sides exist, higher than a potential in a region of the photosensitive region located between the signal charge collecting regions.

7. The range sensor according to claim 6,
wherein the plurality of potential adjusting means are semiconductor regions having the same conductivity type as the photosensitive region and an impurity concentration higher than that of the photosensitive region.

8. The range sensor according to claim 6, further comprising:
a photogate electrode arranged on the photosensitive region,
wherein the plurality of potential adjusting means are electrodes given a potential lower than a potential given to the photogate electrode.

9. A range image sensor which comprises an imaging region consisting of a plurality of units arranged in a one-dimensional or two-dimensional pattern, on a semiconductor substrate and which obtains a range image, based on charge quantities output from the units,
  wherein one said unit is the range sensor as defined in claim 1.

10. The range image sensor according to claim 9,
  wherein a plurality of said photosensitive regions are arranged in a direction in which the first and second short sides of the photosensitive region are opposed to each other, on the semiconductor substrate, and
  wherein the plurality of unnecessary charge collecting gate electrodes are arranged across a boundary between two adjacent photosensitive regions.

* * * * *